(12) United States Patent
Sato et al.

(10) Patent No.: US 8,198,686 B2
(45) Date of Patent: Jun. 12, 2012

(54) SEMICONDUCTOR DEVICE

(75) Inventors: Yoshihiro Sato, Hyogo (JP); Hisashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 9 days.

(21) Appl. No.: 12/629,508

(22) Filed: Dec. 2, 2009

(65) Prior Publication Data

US 2010/0072523 A1    Mar. 25, 2010

Related U.S. Application Data

(63) Continuation of application No. PCT/JP2009/000574, filed on Feb. 13, 2009.

(30) Foreign Application Priority Data

Mar. 13, 2008    (JP) ................................ 2008-064435

(51) Int. Cl.
*H01L 21/70* (2006.01)

(52) U.S. Cl. ......... 257/369; 257/407; 257/412; 257/413

(58) Field of Classification Search ................. 257/369, 257/407, 412, 413; 438/199, 592
See application file for complete search history.

(56) References Cited

U.S. PATENT DOCUMENTS

| | | | |
|---|---|---|---|
| 6,184,083 B1 | 2/2001 | Tsunashima et al. | |
| 6,420,279 B1 * | 7/2002 | Ono et al. | 438/785 |
| 7,361,960 B1 | 4/2008 | Tsunashima et al. | |
| 7,812,414 B2 * | 10/2010 | Hou et al. | 257/412 |
| 2005/0167762 A1 | 8/2005 | Kadoshima et al. | |
| 2006/0094193 A1 | 5/2006 | Horstmann et al. | |
| 2007/0090427 A1 | 4/2007 | Nakajima | |
| 2007/0173025 A1 | 7/2007 | Akamatsu | |
| 2007/0215950 A1 | 9/2007 | Aoyama | |
| 2007/0284670 A1 * | 12/2007 | Yamamoto et al. | 257/369 |

FOREIGN PATENT DOCUMENTS

| | | |
|---|---|---|
| JP | 11-074368 | 3/1999 |
| JP | 2002-118175 | 4/2002 |
| JP | 2007-258267 | 10/2007 |

(Continued)

OTHER PUBLICATIONS

Zhang, Z.B., et al., "Integration of Dual Metal Gate CMOS with TaSiN (NMOS) and Ru (PMOS) Gate Electrodes on HfO$_2$ Gate Dielectric", Symposium on VLSI Technology Digest of Technical Papers, 2005, pp. 50-51.

(Continued)

*Primary Examiner* — Mark Prenty
(74) *Attorney, Agent, or Firm* — McDermott Will & Emery LLP

(57) ABSTRACT

A semiconductor device includes a first MIS transistor and a second MIS transistor. The first MIS transistor includes a first gate electrode includes a second metal film formed on a first gate insulating film, and an insulating film formed, extending over side surfaces of the first gate electrode and upper surfaces of regions located in the first active region laterally outside the first gate electrode. The second MIS transistor includes a second gate electrode including a first metal film formed on a second gate insulating film and a conductive film formed on the first metal film, and the insulating film formed, extending over side surfaces of the second gate electrode and upper surfaces of regions located in the second active region laterally outside the second gate electrode. The first and second metal films are made of different metal materials.

35 Claims, 14 Drawing Sheets

FOREIGN PATENT DOCUMENTS

WO   WO 2006/049834 A1   5/2006

OTHER PUBLICATIONS

Song, S.C., et al., "Highly Manufacturable 45 nm LSTP CMOSFETs Using Novel Dual High-k and Dual Metal Gate CMOS Integration", Symposium on VLSI Technology Digest of Technical Papers, 2006, IEEE.

Hussain, M., et al. "Compatibility of ALD Hafnium Silicate with Dual Metal Gate CMOS Integration", Extended Abstracts of the 2006 International Conference on Solid State Devices and Materials, pp. 1114-1115.

Ootsuka, F., et al., "Full-Metal-Gate Integration of Dual-Metal-Gate HfSiON CMOS Transistors by Using Oxidation-Free Dummy-Mask Process", Extended Abstracts of the 2006 International Conference on Solid State Devices and Materials, pp. 1116-1117.

* cited by examiner

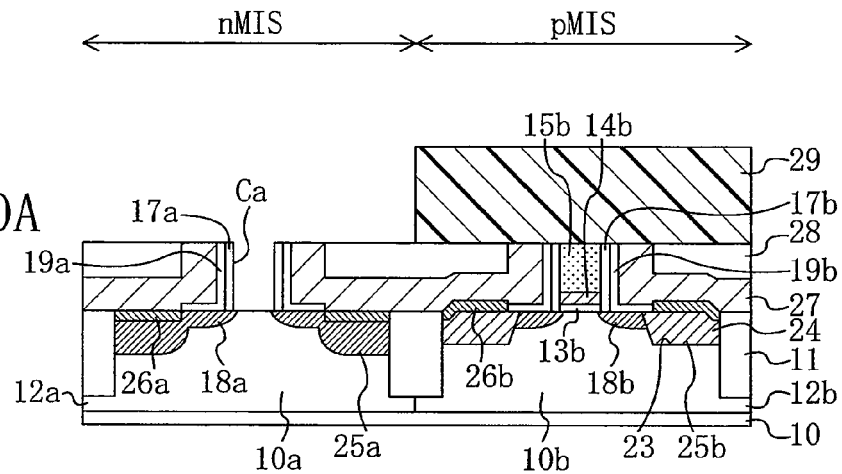
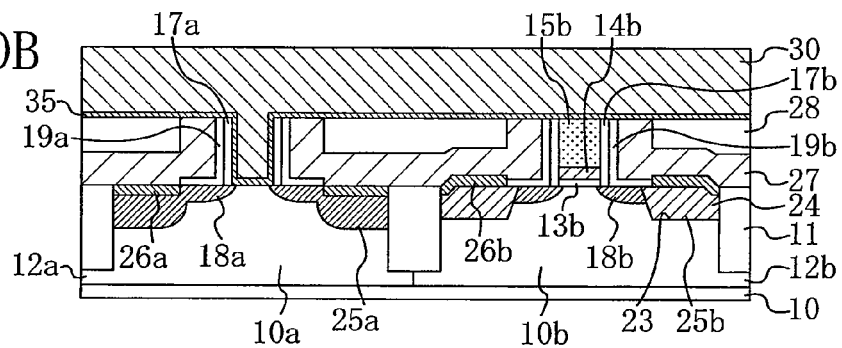
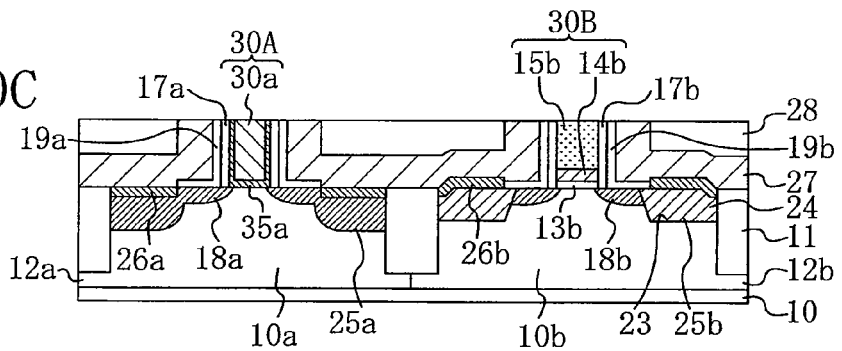

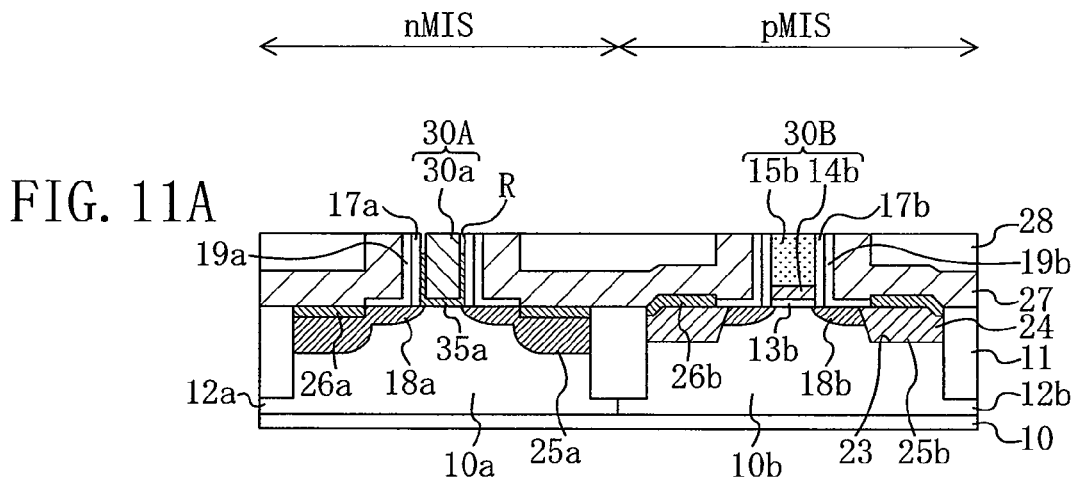
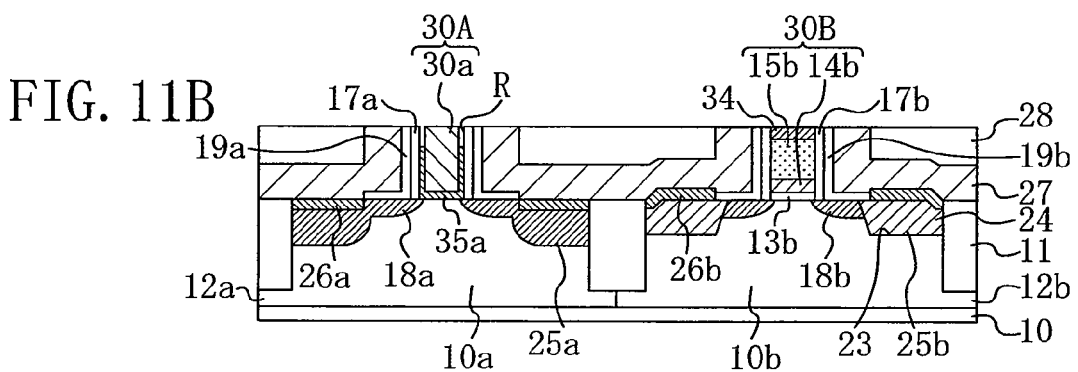
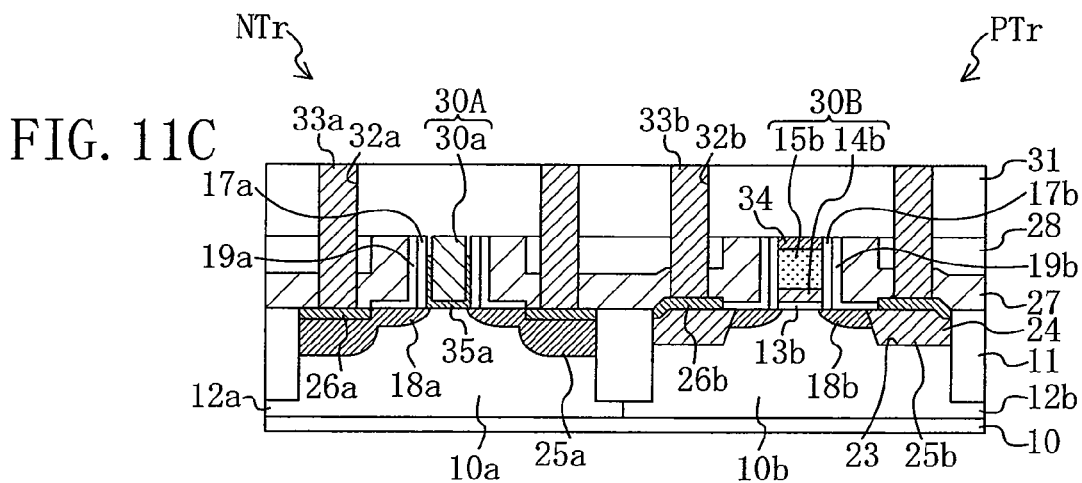

SEMICONDUCTOR DEVICE

CROSS-REFERENCE TO RELATED APPLICATIONS

This is a continuation of PCT International Application PCT/JP2009/000574 filed on Feb. 13, 2009, which claims priority to Japanese Patent Application No. 2008-064435 filed on Mar. 13, 2008. The disclosures of the applications including the specification, the drawings, and the claims are hereby incorporated by reference in their entirety.

BACKGROUND

The present disclosure relates to semiconductor devices and methods for manufacturing the semiconductor devices. More particularly, the present disclosure relates to a semiconductor device including a Metal Insulator Semiconductor Field Effect Transistor (MISFET) having a gate electrode made of a metal material, and a method for manufacturing the semiconductor device.

As the scale and speed of semiconductor integrated circuit devices increase, an attempt is being made to achieve further miniaturization of MISFETs. The further miniaturization of MISFETs is accompanied by an extremely thin thickness of the gate insulating film, leading to problems, such as manifestation of the depletion capacitance of the polysilicon gate electrode and penetration of boron into the channel region. To solve these problems, a semiconductor device with a dual-metal gate structure has been studied in which a metal gate electrode made of a metal material is used as the gate electrode of an n-type MISFET (hereinafter referred to as an "n-type MIS transistor"), and a metal gate electrode made of a metal material is used as the gate electrode of a p-type MISFET (hereinafter referred to as a "p-type MIS transistor").

In the case of the dual-metal gate semiconductor device, the gate electrodes of the n- and p-type MIS transistors need to be made of different metal materials. For example, the gate electrode of the n-type MIS transistor is made of a metal material having a work function of 4.05 eV or more and 4.6 eV or less, and the gate electrode of the p-type MIS transistor is made of a metal material having a work function of 4.6 eV or more and 5.15 eV or less.

As a method for manufacturing the dual-metal gate semiconductor device, for example, a first conventional semiconductor device manufacturing method (see, for example, NON-PATENT DOCUMENT 1) and a second conventional semiconductor device manufacturing method (see, for example, NON-PATENT DOCUMENT 2) have been proposed.

CITATION LIST

Non-Patent Documents

NON-PATENT DOCUMENT 1: Z. B. Zhang et al., "Integration of Dual Metal Gate CMOS with TaSiN (NMOS) and Ru (PMOS) Gate Electrodes on HfO2 Gate Dielectric," VLSI 2005

NON-PATENT DOCUMENT 2: S. C. Song et al., "Highly Manufacturable 45 nm LSTP CMOSFETs Using Novel Dual High-k and Dual Metal Gate CMOS Integration," VLSI 2006

SUMMARY

However, the first and second conventional semiconductor device manufacturing methods have the following problems.

The first conventional semiconductor device manufacturing method and its problems will be described hereinafter in sequence. The first conventional semiconductor device manufacturing method will be described with reference to FIG. 13. FIG. 13 is a cross-sectional view showing main steps of the first conventional semiconductor device manufacturing method, as viewed in a gate width direction thereof. Note that, in FIG. 13, "nMIS" shown on the left side indicates an n-type MIS formation region where an n-type MIS transistor is formed, and "pMIS" shown on the right side indicates a p-type MIS formation region where a p-type MIS transistor is formed.

Initially, an isolation region 101 is selectively formed in an upper portion of a semiconductor substrate 100. As a result, a first active region 100a surrounded by the isolation region 101 is formed in the n-type MIS formation region, and a second active region 100b surrounded by the isolation region 101 is formed in the p-type MIS formation region. Thereafter, a p-type well region 102a is formed in the n-type MIS formation region of the semiconductor substrate 100, and an n-type well region 102b is formed in the p-type MIS formation region of the semiconductor substrate 100.

Next, a gate insulating film formation film, a first metal film made of a gate electrode material for the n-type MIS transistor (hereinafter referred to as an "nMIS metal material"), a second metal film made of a gate electrode material for the p-type MIS transistor (hereinafter referred to as a "pMIS metal material"), and a silicon film are successively formed on the semiconductor substrate 100.

Thus, as shown in FIG. 13, a first patterning portion 107A is formed in which a gate insulating film formation film 103a, a first metal film 104a, a second metal film 105a, and a silicon film 106a are successively formed on the first active region 100a, and a second patterning portion 107B is formed in which a gate insulating film formation film 103b, a second metal film 105b, and a silicon film 106b are successively formed on the second active region 100b.

Thereafter, although not shown, by dry etching using as a mask a resist having a gate pattern, which is formed on the silicon films 106a and 106b, the first patterning portion 107A is subjected to patterning to form a first gate insulating film made of the gate insulating film formation film 103a and a first gate electrode made of the first metal film 104a, the second metal film 105a and the silicon film 106a, while the second patterning portion 107B is subjected to patterning to form a second gate insulating film made of the gate insulating film formation film 103b and a second gate electrode made of the second metal film 105b and the silicon film 106b.

Here, a problem with the first conventional semiconductor device manufacturing method will be described. In the first conventional semiconductor device manufacturing method, as shown in FIG. 13, although the first and second patterning portions 107A and 107B have different structures (specifically, the first patterning portion 107A has a four-layer structure, and the second patterning portion 107B has a three-layer structure), the first and second patterning portions 107A and 107B are subjected to patterning in the same step, i.e., under the same etching condition, and therefore, the first and second gate electrodes cannot both be formed with high precision, which is a problem. For example, when an etching condition is set so that the second gate electrode can be formed with high precision, the first metal film 104a and the gate insulating film formation film 103a in the first patterning portion 107A are not etched and remain, and therefore, the first gate electrode cannot be formed with high precision. On the other hand, for example, when an etching condition is set so that the first gate electrode can be formed with high precision, the semiconductor substrate 100 and the isolation region 101 in the p-type MIS formation region are also etched, and therefore, the second gate electrode cannot be formed with high precision.

The second conventional semiconductor device manufacturing method and its problem will be described hereinafter in sequence. The second conventional semiconductor device manufacturing method will be described with reference to FIGS. 14A-14E. FIGS. 14A-14E are cross-sectional views showing main steps of the second conventional semiconductor device manufacturing method in an order in which the steps are performed, as viewed in a gate width direction thereof. Note that, in FIGS. 14A-14E, "nMIS" shown on the left side indicates an n-type MIS formation region where an n-type MIS transistor is formed, and "pMIS" shown on the right side indicates a p-type MIS formation region where a p-type MIS transistor is formed.

Initially, an isolation region 201 is selectively formed in an upper portion of a semiconductor substrate 200. As a result, a first active region 200a surrounded by the isolation region 201 is formed in the n-type MIS formation region, and a second active region 200b surrounded by the isolation region 201 is formed in the p-type MIS formation region. Thereafter, a p-type well region 202a is formed in the n-type MIS formation region of the semiconductor substrate 200, and an n-type well region 202b is formed in the p-type MIS formation region of the semiconductor substrate 200.

Next, a first gate insulating film formation film made of a gate insulating film material for the n-type MIS transistor (hereinafter referred to as an "nMIS insulating material"), a first metal film made of an nMIS metal material, and a first mask film are successively formed on the semiconductor substrate 200. Thereafter, as shown in FIG. 14A, a resist mask 206 which covers the n-type MIS formation region is formed on the first mask film by photolithography.

Next, the first mask film is etched using the resist mask 206 as a mask to form a first mask film 205a, and thereafter, the resist mask 206 is removed. Thereafter, the first metal film 204 and the first gate insulating film formation film 203 are successively etched using the first mask film 205a as a mask.

Next, as shown in FIG. 14B, a second gate insulating film formation film 207 made of a gate insulating film material for the p-type MIS transistor (hereinafter referred to as a "pMIS insulating material"), a second metal film 208 made of a pMIS metal material, and a second mask film 209 are successively formed on the semiconductor substrate 200. Thereafter, a resist mask 210 which covers the p-type MIS formation region is formed on the second mask film 209 by photolithography.

Next, as shown in FIG. 14C, the second mask film 209 is etched using the resist mask 210 as a mask to form a second mask film 209b, and thereafter, the resist mask 210 is removed. Thereafter, the second metal film 208 and the second gate insulating film formation film 207 are successively etched using the second mask film 209b as a mask.

Next, as shown in FIG. 14D, the first and second mask films 205a and 209b are removed, and thereafter, a silicon film 211 is formed on the first and second metal films 204 and 208.

Thus, as shown in FIG. 14D, a first patterning portion in which the first gate insulating film formation film 203, the first metal film 204 and the silicon film 211 are successively formed is formed on the first active region 200a, and a second patterning portion in which the second gate insulating film formation film 207, the second metal film 208 and the silicon film 211 are successively formed is formed on the second active region 200b.

Next, as shown in FIG. 14E, a resist (not shown) having a gate pattern is formed on the silicon film 211 by photolithography, and thereafter, etching is performed using the resist as a mask to subject the first patterning portion to patterning to form a first gate insulating film 203a, and a first gate electrode 212A including a first metal film 204a and a first silicon film 211a, and to subject the second patterning portion to patterning to form a second gate insulating film 207b, and a second gate electrode 212B including a second metal film 208b and a second silicon film 211b.

Here, a problem with the second conventional semiconductor device manufacturing method will be described with reference to FIG. 15. FIG. 15 is a plan view indicating the problem with the second conventional semiconductor device manufacturing method. Note that line XIVe-XIVe shown in FIG. 15 is a line along which the cross-sectional view of FIG. 14E is taken.

If the resist mask 210 for covering the p-type MIS formation region is formed and deviated in the gate width direction, so that an end portion in the gate width direction of the resist mask 210 is located in the n-type MIS formation region as shown in FIG. 14B, a protruding residual portion r including a residual portion 205c of the first mask film 205a, a residual portion 207c of the second gate insulating film formation film 207, and a residual portion 208c of the second metal film 208, is formed on the isolation region 201 as shown in FIG. 14D.

If patterning is performed while the residual portion r is formed, a patterned residual portion rp extending in a gate length direction is left on the isolation region 201 as shown in FIG. 15 (note that the patterned residual portion rp includes a patterned residual portion 205cp, a patterned residual portion 207cp and a patterned residual portion 208cp as shown in FIG. 14E). In addition, a sidewall insulating film 211c made of the silicon film 211 is formed on side surfaces in the gate width direction of the patterned residual portion rp.

The patterned residual portion rp (or the sidewall insulating film 211c) electrically connects the first and second gate electrodes 212A and 212B to other first and second gate electrodes (not shown) adjacent in the gate length direction to the first and second gate electrodes 212A and 212B, and therefore, the first and second gate electrodes 212A and 212B do not function as a gate electrode. Thus, in the second conventional semiconductor device manufacturing method, the first and second gate electrodes 212A and 212B cannot be formed, which is a problem.

Note that a cause of this problem has been described using a specific example in which the resist mask 210 covering the p-type MIS formation region is deviated and formed in the n-type MIS formation region. However, even if the resist mask 210 is not deviated or formed in the n-type MIS formation region, when the resist mask 206 covering the n-type MIS formation region is deviated and formed in the p-type MIS formation region, a problem similar to that described above arises. Specifically, if the resist mask 206 is deviated and formed in the p-type MIS formation region in the step of FIG. 14A, a protruding residual portion r is formed on the isolation region 201 as shown in FIG. 16.

Here, the aforementioned problem can be avoided by increasing a width in the gate width direction of the isolation region 201. Specifically, a matching margin (margin region) is previously provided for the isolation region 201 to increase the width in the gate width direction of the isolation region 201. As a result, even if the resist mask 206 is formed and deviated in the gate width direction when the resist mask 206 is formed in the step of FIG. 14A, an end portion in the gate width direction of the resist mask 206 can be located in the n-type MIS formation region rather than in the p-type MIS formation region. In addition, even if the resist mask 210 is formed and deviated in the gate width direction when the resist mask 210 is formed in the step of FIG. 14B, an end portion in the gate width direction of the resist mask 210 can be located in the p-type MIS formation region rather than in the n-type MIS formation region. However, in this case, the following problem arises. Specifically, a matching margin is required for the isolation region 201 both when the resist mask 206 is formed and when the resist mask 210 is formed. Therefore, the width in the gate width direction of the isolation region 201 cannot be reduced, which is a problem.

Moreover, in the second conventional semiconductor device manufacturing method, although the first and second patterning portions have different structures (specifically, the first and second patterning portions have the same silicon film 211, but have the different first and second gate insulating film formation films 203 and 207 and the different first and second metal films 204 and 208, respectively), i.e., have different etching characteristics, the first and second patterning portions are subjected to patterning under the same etching condition as shown in FIG. 14D. Therefore, the first and second gate electrodes cannot both be formed with high precision, which is a problem.

Thus, the second conventional semiconductor device manufacturing method has the problem that the first and second gate electrodes can be formed, but not both with high precision, and in addition, the problem that the width in the gate width direction of the isolation region 201 cannot be reduced.

As described above, the first conventional semiconductor device manufacturing method has the problem that the first and second gate electrodes cannot both be formed with high precision. On the other hand, the second conventional semiconductor device manufacturing method has not only the problem that the first and second gate electrodes cannot both be formed with high precision, but also the problem that the width in the gate width direction of the isolation region cannot be reduced.

In view of the aforementioned problems, an object of the present disclosure is to provide a semiconductor device including n- and p-type MIS transistors having gate electrodes made of different metal materials, in which the gate electrodes of the n- and p-type MIS transistors are formed with high precision, and the width in the gate width direction of the isolation region is reduced.

To achieve the object, a semiconductor device according to the present disclosure includes a first MIS transistor and a second MIS transistor. The first MIS transistor includes a first gate insulating film formed on a first active region in a semiconductor substrate, a first gate electrode includes a second metal film formed on the first gate insulating film, and an insulating film formed, extending over side surfaces of the first gate electrode and upper surfaces of regions located in the first active region laterally outside the first gate electrode. The second MIS transistor includes a second gate insulating film formed on a second active region in the semiconductor substrate, a second gate electrode including a first metal film formed on the second gate insulating film and a conductive film formed on the first metal film, and the insulating film formed, extending over side surfaces of the second gate electrode and upper surfaces of regions located in the second active region laterally outside the second gate electrode. The first and second metal films are made of different metal materials. The insulating film is not formed on any of upper surfaces of the first and second gate electrodes.

According to the semiconductor device of the present disclosure, the first and second gate electrodes can be formed with high precision. In addition, an isolation region having a reduced width in a gate width direction thereof can be achieved, whereby the semiconductor device can be further miniaturized.

In the semiconductor device of the present disclosure, the first metal film preferably has a thickness smaller than that of the second metal film.

In the semiconductor device of the present disclosure, the first and second metal films preferably have different work functions.

In the semiconductor device of the present disclosure, the insulating film preferably has a thickness smaller than that of the first gate electrode.

In the semiconductor device of the present disclosure, the conductive film is preferably made of the second metal film.

In the semiconductor device of the present disclosure, the conductive film is preferably made of a silicon film. The semiconductor device preferably further includes a metal silicide film formed on the silicon film.

In the semiconductor device of the present disclosure, the first and second gate insulating films are preferably made of the same insulating material.

In the semiconductor device of the present disclosure, the first and second gate insulating films are preferably made of different insulating materials.

The semiconductor device of the present disclosure preferably further includes a first inner sidewall having an L-shaped cross-section formed on each of side surfaces of the first gate electrode, and a second inner sidewall having an L-shaped cross-section formed on each of side surfaces of the second gate electrode. The insulating film is preferably formed above and in contact with the first and second inner sidewalls.

In the semiconductor device of the present disclosure, the insulating film is preferably a stress insulating film which causes first stress in a gate length direction of a channel region in the first active region.

In this case, the stress insulating film can apply the first stress in the gate length direction of the channel region in the first active region, whereby the drive capability of the first MIS transistor can be improved.

In the semiconductor device of the present disclosure, the first MIS transistor is preferably an n-type MIS transistor. The insulating film is preferably made of a silicon nitride film. The first stress is preferably tensile stress.

The semiconductor device of the present disclosure preferably further includes source/drain regions formed in the second active region laterally outside the second gate electrode. The source/drain regions are preferably formed in respective trenches provided in the second active region, and preferably include a silicon mixed crystal layer which causes second stress in a gate length direction of a channel region in the second active region.

In this case, the silicon mixed crystal layer can apply the second stress in the gate length direction of the channel region in the second active region, whereby the drive capability of the second MIS transistor can be improved.

In the semiconductor device of the present disclosure, the second MIS transistor is preferably a p-type MIS transistor. The silicon mixed crystal layer is preferably made of a SiGe layer. The second stress is preferably compressive stress.

In the semiconductor device of the present disclosure, the first and second gate insulating films preferably include a high-k film made of a metal oxide having a relative dielectric constant of 10 or more.

To achieve the object, a semiconductor device manufacturing method according to the present disclosure is a method for manufacturing a semiconductor device including a first MIS transistor formed on a first active region in a semiconductor substrate and a second MIS transistor formed on a second active region in the semiconductor substrate. The method includes the steps of (a) forming a first gate electrode formation portion having a first gate insulating film, a first metal film and a first silicon film on the first active region, and a second gate electrode formation portion having a second gate insulating film, a first metal film and a second silicon film on the second active region, (b) after step (a), forming an insulating film on the semiconductor substrate, the insulating film covering the first and second gate electrode formation portions, (c) removing the insulating film formed on the first and second gate electrode formation portions to expose an upper surface of each of the first silicon film in the first gate electrode formation portion and the second silicon film in the second gate electrode formation portion, (d) after step (c), successively removing the first silicon film and the first metal film in the first gate electrode formation portion to form a first recess surrounded by the insulating film on the first active region, and (e) forming a second metal film in the first recess. A first gate electrode of the first MIS transistor includes the second metal film. A second gate electrode of the second MIS transistor includes the first metal film in the second gate electrode formation portion.

According to the semiconductor device manufacturing method of the present disclosure, after the first and second gate electrode formation portion are formed in the same step, the second metal film is formed in the first recess which has been formed by successively removing the first silicon film and the first metal film in the first gate electrode formation portion, to form the first gate electrode including the second metal film. On the other hand, the second gate electrode including the first metal film in the second gate electrode formation portion is formed. Therefore, when the first silicon film and the first metal film in the first gate electrode formation portion is replaced with the second metal film, a matching margin is required for the isolation region. On the other hand, when the first and second gate electrode formation portions are formed, a matching margin is not required for the isolation region. Therefore, the number of steps in which a matching margin is required for the isolation region can be reduced, whereby a width in the gate width direction of the matching margin can be reduced, and therefore, a width in the gate width direction of the isolation region can be reduced. As a result, the semiconductor device can be further miniaturized.

In addition, as the first and second gate electrode formation portions having the same structure (in other words, the first and second gate electrode formation portions having the same etching characteristic) are formed in the same step, the first and second gate electrode formation portions can be easily formed with high precision. As a result, the first metal film and the first silicon film in the first gate electrode formation portion which has been formed with high precision can be replaced with the second metal film to form the first gate electrode including the second metal film. On the other hand, as the second gate electrode including the first metal film in the second gate electrode formation portion which has been formed with high precision can be formed. As a result, the first and second gate electrodes can be formed with high precision.

In the semiconductor device manufacturing method of the present disclosure, step (d) preferably includes forming, on the first active region, the first recess from a bottom of which the first gate insulating film is exposed, and removing the second silicon film in the second gate electrode formation portion to form, on the second active region, a second recess surrounded by the insulating film, the first metal film being exposed from a bottom of the second recess. Step (e) preferably includes forming the second metal film on the first gate insulating film in the first recess, and forming the second metal film on the first metal film in the second recess. The second gate electrode preferably includes the first metal film in the second gate electrode formation portion and the second metal film formed on the first metal film.

In this case, when the first metal film in the first gate electrode formation portion is removed, a matching margin is required for the isolation region. On the other hand, when the first and second gate electrode formation portions are formed, a matching margin is not required for the isolation region. Therefore, the number of steps in which a matching margin is required for the isolation region can be suppressed to one.

In the semiconductor device manufacturing method of the present disclosure, step (d) preferably includes forming, on the first active region, the first recess from a bottom of which the first gate insulating film is exposed. Step (e) preferably includes forming the second metal film on the first gate insulating film in the first recess. The method preferably further includes the step of (f) after step (e), forming a metal silicide film on the second silicon film. The second gate electrode preferably includes the first metal film and the second silicon film in the second gate electrode formation portion.

In this case, when the first silicon film and the first metal film in the first gate electrode formation portion are removed, a matching margin is required for the isolation region. On the other hand, when the first and second gate electrode formation portions are formed, a matching margin is not required for the isolation region. Therefore, the number of steps in which a matching margin is required for the isolation region can be suppressed to one.

In the semiconductor device manufacturing method of the present disclosure, step (d) preferably includes successively removing the first silicon film, the first metal film, and the first gate insulating film in the first gate electrode formation portion, to form, on the first active region, the first recess from a bottom of which the first active region is exposed. Step (e) preferably includes forming a third gate insulating film in the first recess, and forming the second metal film on the third gate insulating film. The method preferably further includes the step of (f) after step (e), forming a metal silicide film on the second silicon film. The second gate electrode preferably includes the first metal film and the second silicon film in the second gate electrode formation portion.

In this case, when the first silicon film, the first metal film and the first gate insulating film in the first gate electrode formation portion are removed, a matching margin is required for the isolation region. On the other hand, when the first and second gate electrode formation portions are formed, a matching margin is not required for the isolation region. Therefore, the number of steps in which a matching margin is required for the isolation region can be suppressed to one.

The semiconductor device manufacturing method of the present disclosure preferably further includes the step of (g) after step (a) and before step (b), forming a first inner sidewall having an L-shaped cross-section on each of side surfaces of the first gate electrode formation portion, and a second inner sidewall having an L-shaped cross-section on each of side surfaces of the second gate electrode formation portion. In step (b), the insulating film is preferably formed above and in contact with the first and second inner sidewalls.

The semiconductor device manufacturing method of the present disclosure preferably further includes the steps of (h) after step (a) and before step (b), forming trenches in the second active region laterally outside the second gate electrode formation portion, and (i) forming, in the trenches, a silicon mixed crystal layer which causes stress in a gate length direction of a channel region in the second active region.

According to the semiconductor device of the present disclosure and the manufacture method of the semiconductor device, the first and second gate electrode formation portions are formed in the same step, and thereafter, the second metal film is formed in the first recess which has been formed by successively removing the first silicon film and the first metal film in the first gate electrode formation portion, to form the first gate electrode including the second metal film. On the other hand, the second gate electrode including the first metal film in the second gate electrode formation portion is formed. Therefore, when the first silicon film and the first metal film in the first gate electrode formation portion are replaced with the second metal film, a matching margin is required for the isolation region. On the other hand, when the first and second gate electrode formation portions are formed, a matching margin is not required for the isolation region. Therefore, the number of steps in which a matching margin is required for the isolation region can be reduced, whereby a width in the gate width direction of the matching margin can be reduced, and therefore, a width in the gate width direction of the isolation region can be reduced. As a result, the semiconductor device can be further miniaturized.

In addition, as the first and second gate electrode formation portions having the same structure are formed in the same step, the first and second gate electrode formation portions can be easily formed with high precision. As a result, the first gate electrode including the second metal film can be formed by replacing the first metal film and the first silicon film in the first gate electrode formation portion, which has been formed with high precision, with the second metal film. On the other hand, the second gate electrode including the first metal film in the second gate electrode formation portion, which has been formed with high precision, can be formed. As a result, the first and second gate electrodes can be formed with high precision.

BRIEF DESCRIPTION OF THE DRAWINGS

FIGS. 10A-10C are cross-sectional views showing main steps of a method for manufacturing a semiconductor device according to a variation of the second embodiment of the present disclosure in an order in which the steps are performed, as viewed in a gate length direction thereof.

FIGS. 11A-11C are cross-sectional views showing main steps of the manufacture method of the semiconductor device of the variation of the second embodiment of the present disclosure in an order in which the steps are performed, as viewed in a gate length direction thereof.

DETAILED DESCRIPTION

Embodiments of the present disclosure will be described hereinafter with reference to the accompanying drawings.

First Embodiment

A semiconductor device according to a first embodiment of the present disclosure and a method for manufacturing the semiconductor device will be described with reference to the drawings.

The method for manufacturing the semiconductor device of the first embodiment of the present disclosure will be described hereinafter with reference to FIGS. 1A-1D, FIGS. 2A-2D, FIGS. 3A-3D, FIGS. 4A-4C, and FIGS. 5A-5C. FIGS. 1A-5C are cross-sectional views showing main steps of the manufacture method of the semiconductor device of the first embodiment of the present disclosure in an order in which the steps are performed, as viewed in a gate length direction thereof. Note that, in FIGS. 1A-5C, "nMIS" shown on the left side indicates an n-type MIS formation region where an n-type MIS transistor is formed, and "pMIS" shown on the right side indicates a p-type MIS formation region where a p-type MIS transistor is formed.

Figure 1A:
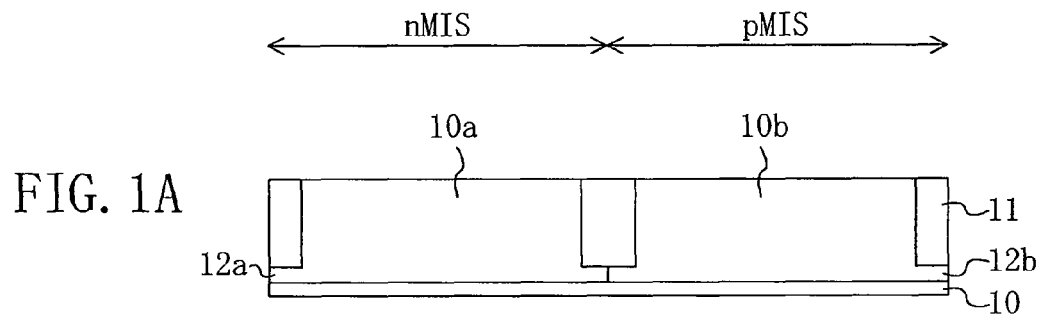
FIGS. 1A-1D are cross-sectional views showing main steps of a method for manufacturing a semiconductor device according to a first embodiment of the present disclosure in an order in which the steps are performed, as viewed in a gate length direction thereof.

Initially, as shown in FIG. 1A, an isolation region 11 which is a trench filled with an insulating film is selectively formed in an upper portion of a semiconductor substrate 10 made of, for example, p-type silicon by, for example, Shallow Trench Isolation (STI). As a result, a first active region 10a made of the semiconductor substrate 10 surrounded by the isolation region 11 is formed in the n-type MIS formation region, and a second active region 10b made of the semiconductor substrate 10 surrounded by the isolation region 11 is formed in the p-type MIS formation region. Thereafter, a p-type impurity, such as B (boron) or the like, is implanted into the n-type MIS formation region of the semiconductor substrate 10 by lithography and ion implantation, and an n-type impurity, such as P (phosphorus) or the like, is implanted into the p-type MIS formation region of the semiconductor substrate 10 by lithography and ion implantation. Thereafter, the semiconductor substrate 10 is subjected to, for example, a thermal treatment at 850° C. for 30 sec, to form a p-type well region 12a in the n-type MIS formation region of the semiconductor substrate 10, and the n-type well region 12b in the p-type MIS formation region of the semiconductor substrate 10.

Figure 1B:
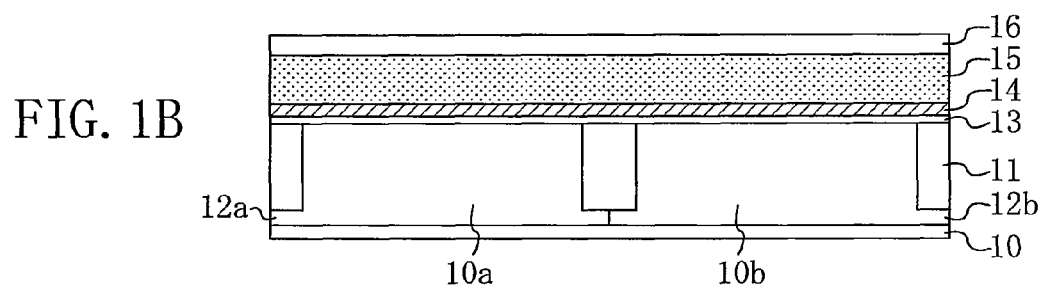

Next, as shown in FIG. 1B, a surface of the semiconductor substrate 10 is cleaned by, for example, a diluted hydrofluoric acid treatment, and thereafter, an underlying film (not shown) made of a silicon oxide film having a thickness of about 0.8 to 1 nm is formed on the first active region 10a and the second active region 10b by, for example, In-Situ Steam Generation (ISSG) oxidation. Thereafter, a gate insulating film formation film 13 made of, for example, a high-k film having a thickness of 2 nm is deposited on the underlying film by, for example, Metal Organic Chemical Vapor Deposition (MOCVD). Here, the gate insulating film formation film 13 desirably includes a high-k film made of a metal oxide having a relative dielectric constant of 10 or more.

Thereafter, a first metal film 14 made of, for example, titanium nitride (TiN) is deposited by, for example, CVD (Chemical Vapor Deposition), ALD (Atomic Layer Deposition), sputtering or the like. Here, the first metal film 14 is desirably made of a metal material or a metal compound material (hereinafter referred to as a "pMIS metal material") which is optimized for the p-type MIS transistor, and desirably has a work function of 4.6 eV or more and 5.15 eV or less. Examples of the first metal film 14 include, in addition to a TiN film, metals such as titanium (Ti), ruthenium (Ru), platinum (Pt), tungsten (W) and the like, nitrides containing at least one metal of Ti, Ru, Pt and W, carbon nitride, silicon nitride, and the like. Thereafter, a silicon film 15 made of, for example, a polysilicon film having a thickness of 100 nm is deposited on the first metal film 14 by, for example, CVD, and thereafter, a protective film 16 made of, for example, a silicon oxide film having a thickness of 30 nm is formed on the silicon film 15 by, for example, CVD.

Figure 1C:
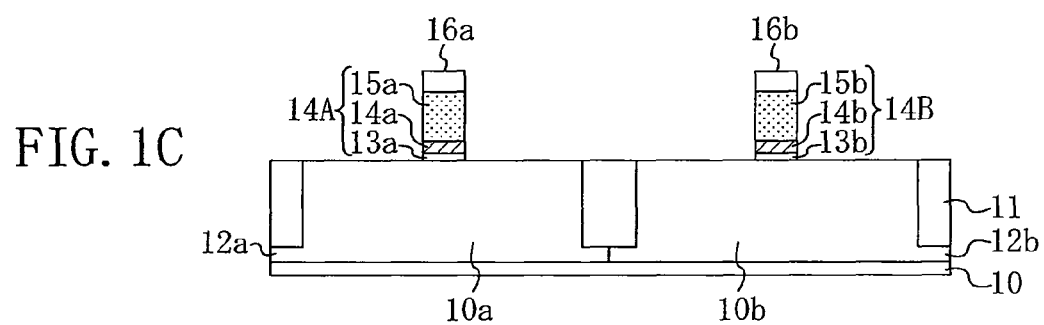

Next, as shown in FIG. 1C, a resist (not shown) having a gate pattern is formed on the protective film 16 by photolithography. Thereafter, the protective film 16, the silicon film 15, the first metal film 14 and the gate insulating film formation film 13 are successively subjected to patterning by dry etching using the resist as a mask. As a result, a first gate insulating film 13a, a first metal film 14a, a first silicon film 15a and a first protective film 16a are successively formed on the first active region 10a, and a second gate insulating film 13b, a first metal film 14b, a second silicon film 15b and a second protective film 16b are successively formed on the second active region 10b.

Thus, a first gate electrode formation portion 14A having the first gate insulating film 13a, the first metal film 14a and the first silicon film 15a is formed on the first active region 10a, and a second gate electrode formation portion 14B having the second gate insulating film 13b, the first metal film 14b and the second silicon film 15b is formed on the second active region 10b.

Figure 1D:
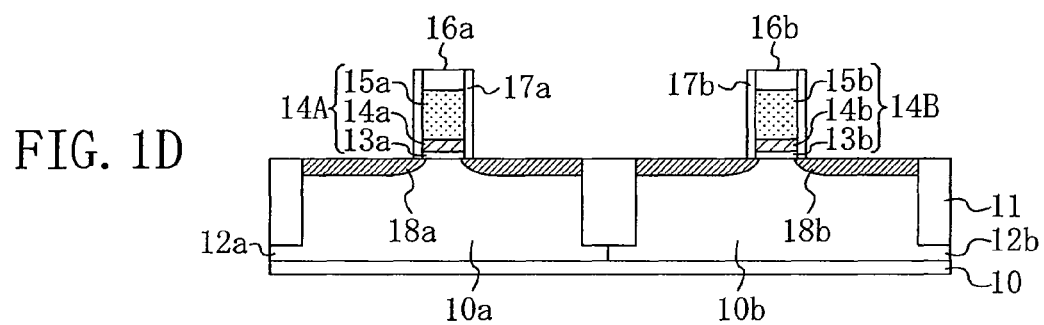

Next, as shown in FIG. 1D, an insulating film made of, for example, a silicon oxide film having a thickness of 10 nm, which is to become an offset spacer, is deposited on an entire surface of the semiconductor substrate 10 by, for example, CVD, and thereafter, the offset spacer insulating film is subjected to anisotropic etching. As a result, a first offset spacer 17a is formed on each of side surfaces of the first gate electrode formation portion 14A, and a second offset spacer 17b is formed on each of side surfaces of the second gate electrode formation portion 14B.

Thereafter, a resist (not shown) which does not cover the n-type MIS formation region and covers the p-type MIS formation region is formed on the semiconductor substrate 10, and thereafter, an n-type impurity, such as As (arsenic) or the like, is implanted into the first active region 10a using the first gate electrode formation portion 14A as a mask, to form n-type source/drain regions (LDD regions or extension regions) 18a having a relatively shallow junction depth in the first active region 10a adjacent to the channel region below the first gate electrode formation portion 14A and extending laterally away from it (or referred to as "in the first active region 10a laterally outside the first gate electrode formation portion 14A"), in a self-alignment manner. On the other hand, a resist (not shown) which covers the n-type MIS formation region and does not cover the p-type MIS formation region is formed on the semiconductor substrate 10, and thereafter, a p-type impurity, such as $BF_2$ or the like, is implanted into the second active region 10b using the second gate electrode formation portion 14B as a mask, to form p-type source/drain regions (LDD regions or extension regions) 18b having a relatively shallow junction depth in the second active region 10b adjacent to the channel region below the second gate electrode formation portion 14B and extending laterally away from it (or referred to as "in the second active region 10b laterally outside the second gate electrode formation portion 14B"), in a self-alignment manner.

Figure 2A:
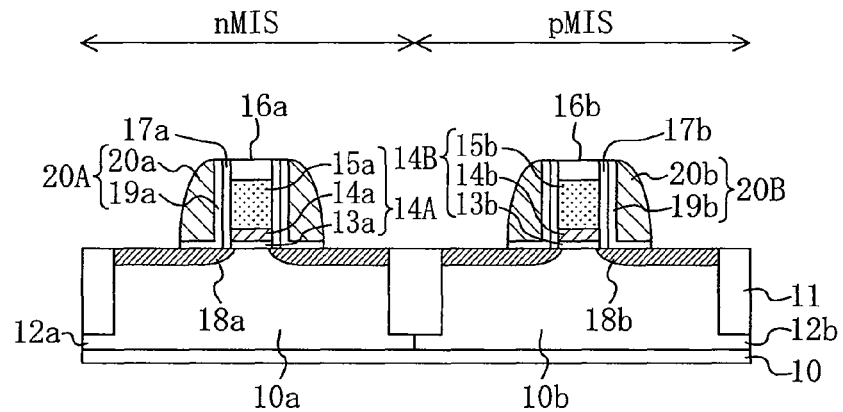
FIGS. 2A-2D are cross-sectional views showing main steps of the manufacture method of the semiconductor device of the first embodiment of the present disclosure in an order in which the steps are performed, as viewed in a gate length direction thereof.

Next, as shown in FIG. 2A, a first insulating film made of, for example, a silicon oxide film having a thickness of 10 nm and a second insulating film made of, for example, a silicon nitride film having a thickness of 30 nm are successively deposited on an entire surface of the semiconductor substrate 10 by, for example, CVD, and thereafter, the first and second insulating films are subjected to anisotropic etching. As a result, a first sidewall 20A including a first inner sidewall 19a made of the first insulating film having an L-shaped cross-section and a first outer sidewall 20a made of the second insulating film formed on the first inner sidewall 19a, is formed on each of side surfaces of the first gate electrode formation portion 14A with the first offset spacer 17a being interposed therebetween, and a second sidewall 20B including a second inner sidewall 19b made of the first insulating film having an L-shaped cross-section and a second outer sidewall 20b made of the second insulating film formed on the second inner sidewall 19b, is formed on each of side surfaces of the second gate electrode formation portion 14B with the second offset spacer 17b being interposed therebetween.

Figure 2B:
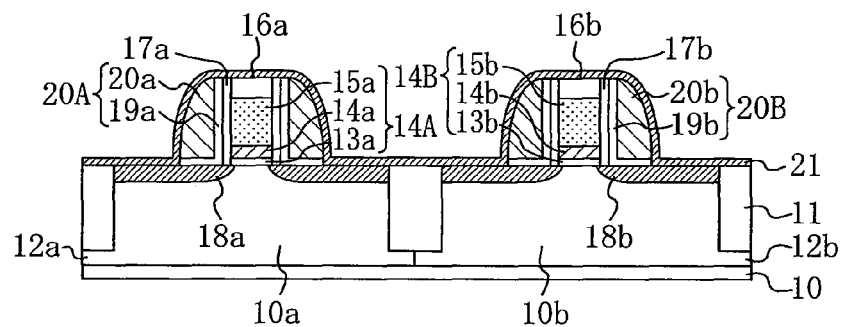

Next, as shown in FIG. 2B, a surface protective film 21 made of, for example, a silicon oxide film having a thickness of 10 nm is deposited on an entire surface of the semiconductor substrate 10 by, for example, CVD.

Figure 2C:
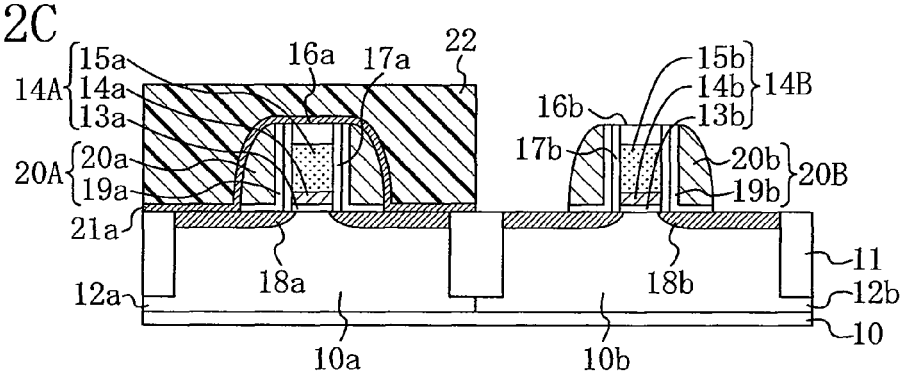

Next, as shown in FIG. 2C, a resist mask 22 which covers the n-type MIS formation region and does not cover the p-type MIS formation region is formed on the surface protective film 21, and thereafter, the surface protective film 21 formed in the p-type MIS formation region is removed, leaving the surface protective film 21a in the n-type MIS formation region, by anisotropic dry etching having a selectivity ratio with respect to the second outer sidewalls 20b (silicon nitride film). As a result, surfaces of regions (i.e., source and drain formation regions) in the second active region 10b laterally outside the second sidewall 20B, are exposed.

Figure 2D:
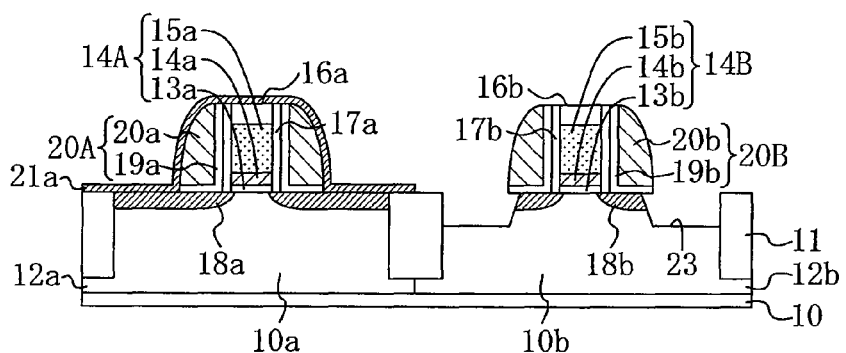

Next, as shown in FIG. 2D, the resist mask 22 is removed, and thereafter, the second active region 10b whose surface is exposed is etched using dry etching having a selectivity ratio with respect to the surface protective film 21a (silicon oxide film), the second protective film 16b (silicon oxide film), the second offset spacer 17b (silicon oxide film), the second inner sidewall 19b (silicon oxide film) and the second outer sidewall 20b (silicon nitride film), or using a successive combination of dry etching and wet etching having a selectivity ratio with respect to these films. As a result, trenches 23 having a depth of, for example, 60 nm is formed in regions (i.e., source and drain formation regions) in the second active region 10b laterally outside the second sidewall 20B. In this case, as a surface of the first active region 10a is covered with the surface protective film 21a, the first active region 10a is not etched. Also, as an upper surface the first silicon film 15a is covered with the first protective film 16a and the surface protective film 21a successively, and an upper surface of the second silicon film 15b is covered with the second protective film 16b, none of the first and second silicon films 15a and 15b is etched.

Figure 3A:
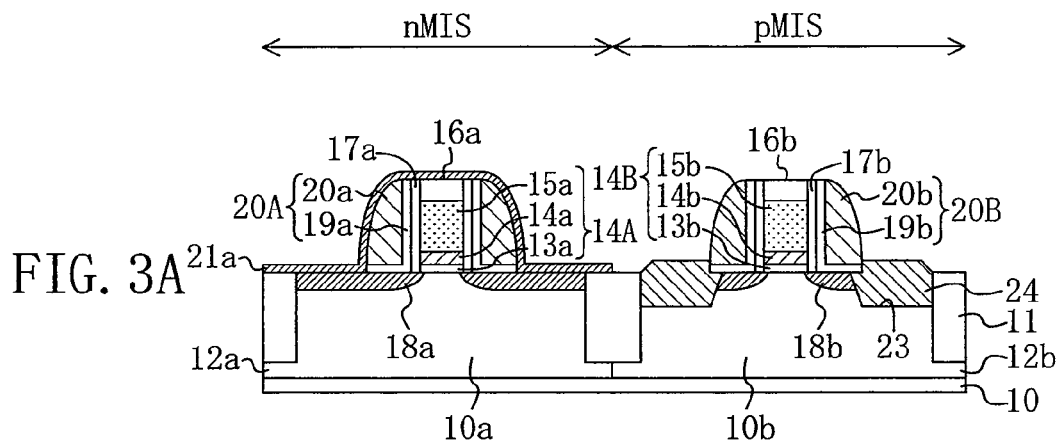
FIGS. 3A-3D are cross-sectional views showing main steps of the manufacture method of the semiconductor device of the first embodiment of the present disclosure in an order in which the steps are performed, as viewed in a gate length direction thereof.

Next, as shown in FIG. 3A, etching residues, natural oxide film and the like in the trench 23 are removed by, for example, a hydrofluoric acid treatment, and thereafter, a silicon mixed crystal layer 24 made of a p-type SiGe layer is epitaxially grown so that the trench 23 is filled with the silicon mixed crystal layer 24, by, for example, CVD with a supply of, for example, silane gas ($SiH_4$) and germane gas ($GeH_4$) along with p-type dopant gas, such as diborane gas ($B_2H_6$) or the like, at a temperature of for example, 650 to 700° C. In this case, as the surface of the first active region 10a is covered with the surface protective film 21a, a SiGe layer is not epitaxially grown on the first active region 10a. Also, as the upper surface of the first silicon film 15a is covered with the first protective film 16a and the surface protective film 21a successively, and the upper surface of the second silicon film 15b is covered with the second protective film 16b, a SiGe layer is not epitaxially grown on any of the first and second silicon films 15a and 15b.

Thereafter, the surface protective film 21a formed in the n-type MIS formation region is removed by dry etching having a selectivity ratio with respect to the semiconductor substrate 10 and the first outer sidewall 20a (silicon nitride film) or using a successive combination of dry etching and wet etching with respect to these films, whereby surfaces of regions (i.e., source and drain formation regions) in the first active region 10a laterally outside the first sidewall 20A, are exposed.

Thus, by successively performing the steps of FIGS. 2B-3A, the silicon mixed crystal layer 24 which causes compressive stress in the gate length direction of the channel region in the second active region 10b is formed in the trenches 23 formed in the second active region 10b laterally outside the second sidewall 20B.

Figure 3B:
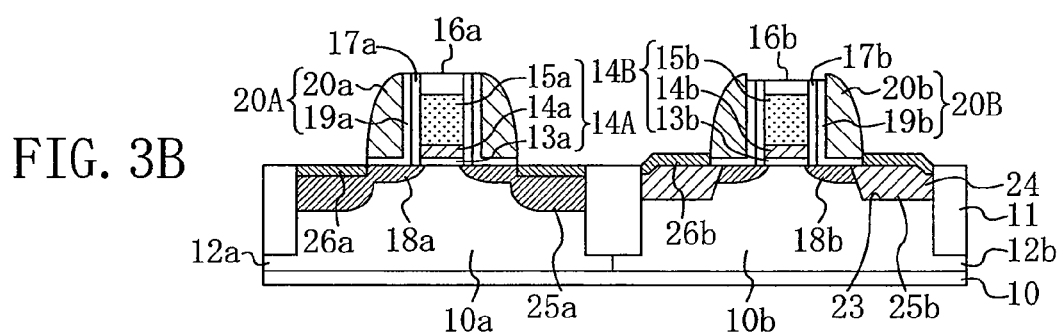

Next, as shown in FIG. 3B, an n-type impurity, such as As (arsenic) or the like, is implanted into the first active region 10a by lithography and ion implantation using the first gate electrode formation portion 14A, the first offset spacer 17a and the first sidewall 20A as a mask, to form n-type source/drain regions 25a having a deeper junction depth than that of the shallow n-type source/drain regions 18a (i.e., having a relatively deep junction depth), in the first active region 10a laterally outside the first sidewall 20A, in a self-alignment manner. On the other hand, a p-type impurity, such as B (boron) or the like, is implanted into the second active region 10b using the second gate electrode formation portion 14B, the second offset spacer 17b and the second sidewall 20B as a mask, to form p-type source/drain regions 25b having a deeper junction depth than that of the shallow p-type source/drain regions 18b (i.e., having a relatively deep junction depth), in the second active region 10b laterally outside the second sidewall 20B, in a self-alignment manner. Thereafter, the impurities contained in the deep n-type source/drain regions 25a and the deep p-type source/drain regions 25b are activated by a thermal treatment.

Thus, the deep p-type source/drain regions 25b include the silicon mixed crystal layer 24 formed in the trenches 23 provided in the second active region 10b.

Next, natural oxide film (not shown) formed on surfaces of the deep n-type source/drain regions 25a and the deep p-type source/drain regions 25b is removed, and thereafter, a metal film (not shown) made of, for example, nickel having a thickness of 10 nm is deposited on an entire surface of the semiconductor substrate 10 by sputtering. Thereafter, Si in the deep n-type source/drain regions 25a and the deep p-type source/drain regions 25b and Ni in the metal film are caused to react with each other by, for example, a first Rapid Thermal Annealing (RTA) treatment in nitrogen atmosphere at 320° C., thereby forming first and second metal silicide films 26a and 26b made of nickel silicide in upper portions of the deep n-type source/drain regions 25a and the deep p-type source/drain regions 25b.

Thereafter, the semiconductor substrate 10 is immersed in an etchant which is a mixture solution of sulfuric acid and hydrogen peroxide in water, to remove unreacted metal film remaining on the isolation region 11, the first and second offset spacers 17a and 17b, the first and second sidewalls 20A and 20B and the like, followed by a second RTA treatment at a higher temperature (e.g., 550° C.) than that in the first RTA treatment, thereby stabilizing the silicide composition ratio of the first and second metal silicide films 26a and 26b.

Figure 3C:
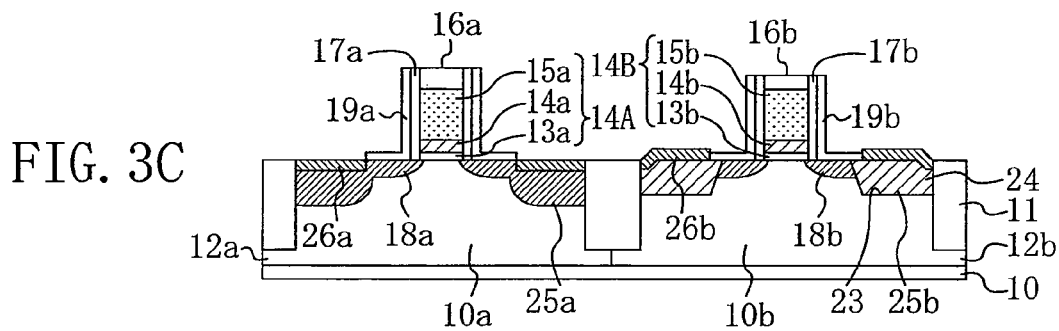

Next, as shown in FIG. 3C, the first outer sidewall 20a (silicon nitride film) and the second outer sidewall 20b (silicon nitride film) are removed by, for example, dry etching having a selectivity ratio with respect to the first and second inner sidewalls 19a and 19b (silicon oxide film).

Figure 3D:
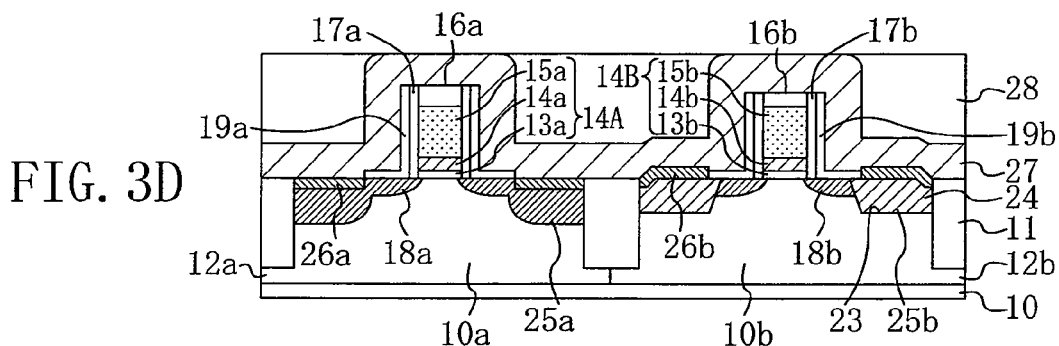

Next, as shown in FIG. 3D, an insulating film 27 made of, for example a silicon nitride film having a thickness of 50 nm is deposited on an entire surface of the semiconductor substrate 10 by, for example, plasma CVD.

Thus, the insulating film 27 is formed, covering the first gate electrode formation portion 14A on a surface of which the first protective film 16a is formed, and the second gate electrode formation portion 14B on a surface of which the second protective film 16b is formed. Thereafter, the insulating film 27 is formed above and in contact with the first inner sidewall 19a having an L-shaped cross-section from which the first outer sidewall 20a is removed and the second inner sidewall 19b having an L-shaped cross-section from which the second outer sidewall 20b is removed.

Thereafter, a first inter-layer insulating film 28 made of a silicon oxide film is deposited on the insulating film 27 by, for example, CVD, and thereafter, the first inter-layer insulating film 28 is removed by polishing while planarizing a surface of the first inter-layer insulating film 28 by, for example, Chemical Mechanical Polishing (CMP), until an upper surface of the insulating film 27 formed on the first and second protective films 16a and 16b is exposed.

Figure 4A:
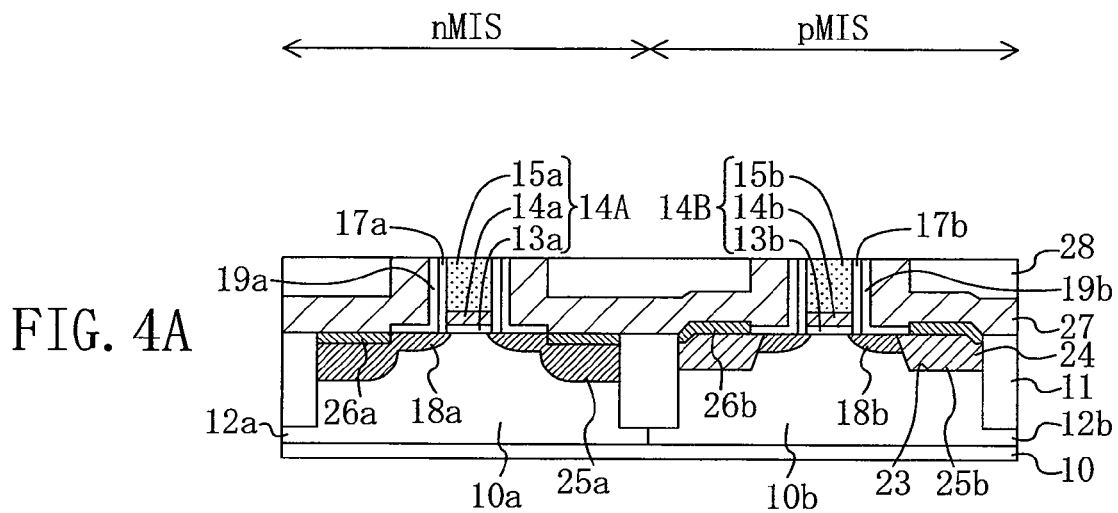
FIGS. 4A-4C are cross-sectional views showing main steps of the manufacture method of the semiconductor device of the first embodiment of the present disclosure in an order in which the steps are performed, as viewed in a gate length direction thereof.

Next, as shown in FIG. 4A, the first and second protective films (silicon oxide films) 16a and 16b and the insulating film (silicon nitride film) 27 formed on the first and second gate electrode formation portions 14A and 14B are removed by dry etching or wet etching having a selectivity ratio with respect to the first and second silicon films (polysilicon films) 15a and 15b, thereby exposing upper surfaces of the first silicon film 15a in the first gate electrode formation portion 14A and the second silicon film 15b in the second gate electrode formation portion 14B. In this case, the first and second offset spacers 17a and 17b, the first and second inner sidewalls 19a and 19b, the insulating film 27, and the first inter-layer insulating film 28 formed laterally outside the first and second gate electrode formation portions 14A and 14B are removed until a height of upper surfaces thereof becomes the same as or similar to a height of upper surfaces of the first and second silicon films 15a and 15b.

Thus, the insulating film 27 is formed, extending over side surfaces of the first and second gate electrode formation portions 14A and 14B and upper surfaces of regions located in the first and second active regions 10a and 10b laterally outside the first and second gate electrode formation portions 14A and 14B, and the insulating film 27 is not formed on any of upper surfaces of the first and second gate electrode formation portions 14A and 14B.

Figure 4B:
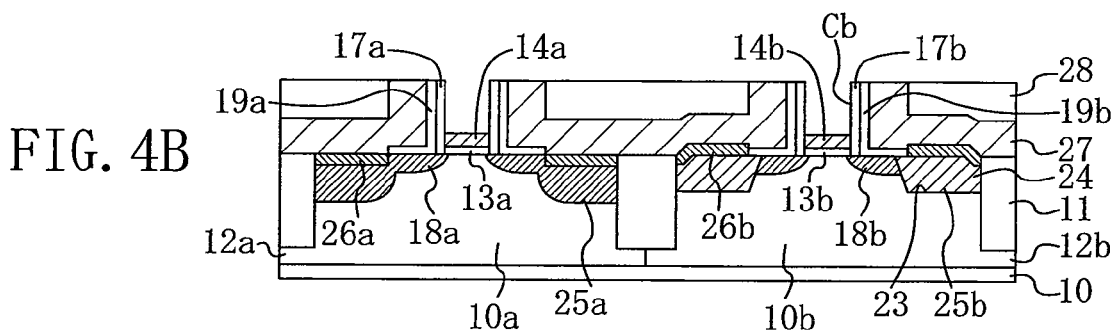

Next, as shown in FIG. 4B, the first silicon film 15a in the first gate electrode formation portion 14A and the second silicon film 15b in the second gate electrode formation portion 14B are removed by dry etching or wet etching having a selectivity ratio with respect to the first metal films (TiN films) 14a and 14b, the first and second offset spacers 17a and 17b, the first and second inner sidewalls 19a and 19b, the insulating film 27, and the first inter-layer insulating film 28.

Figure 4C:
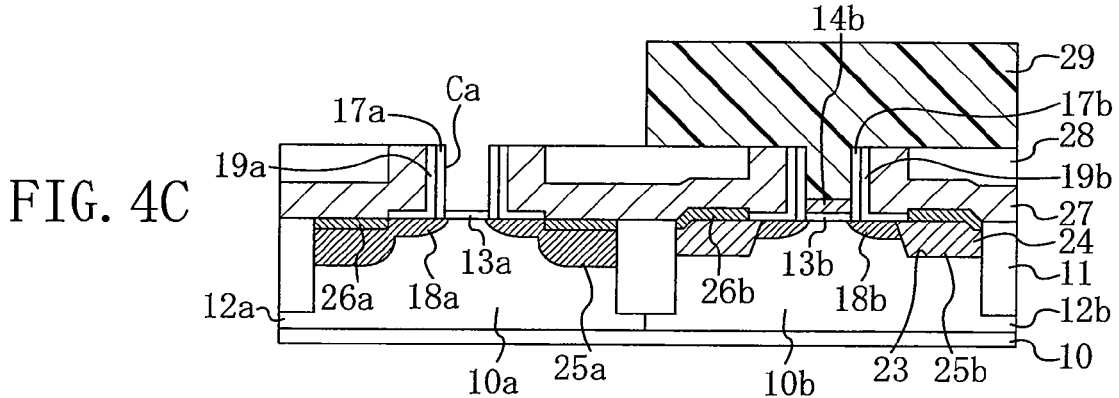

Next, as shown in FIG. 4C, a resist mask 29 which does not cover the n-type MIS formation region and covers the p-type MIS formation region is formed on the semiconductor substrate 10, and thereafter, the first metal film 14a in the first gate electrode formation portion 14A is removed by wet etching having a selectivity ratio with respect to the first gate insulating film 13a, the first offset spacer 17a, the first inner sidewall 19a, the insulating film 27, and the first inter-layer insulating film 28.

Thus, by successively performing the steps of FIGS. 4B and 4C, the first silicon film 15a and the first metal film 14a in the first gate electrode formation portion 14A are successively removed to form, on the first active region 10a, a first recess Ca surrounded by the insulating film 27 with the first offset spacer 17a and the first inner sidewall 19a being successively interposed therebetween. The first gate insulating film 13a is exposed from a bottom of the first recess Ca. In addition, by performing the step of FIG. 4B, the second silicon film 15b in the second gate electrode formation portion 14B is removed to form, on the second active region 10b, a second recess Cb surrounded by the insulating film 27 with the second offset spacer 17b and the second inner sidewall 19b being successively interposed therebetween. The first metal film 14b is exposed from a bottom of the second recess Cb.

Figure 5A:
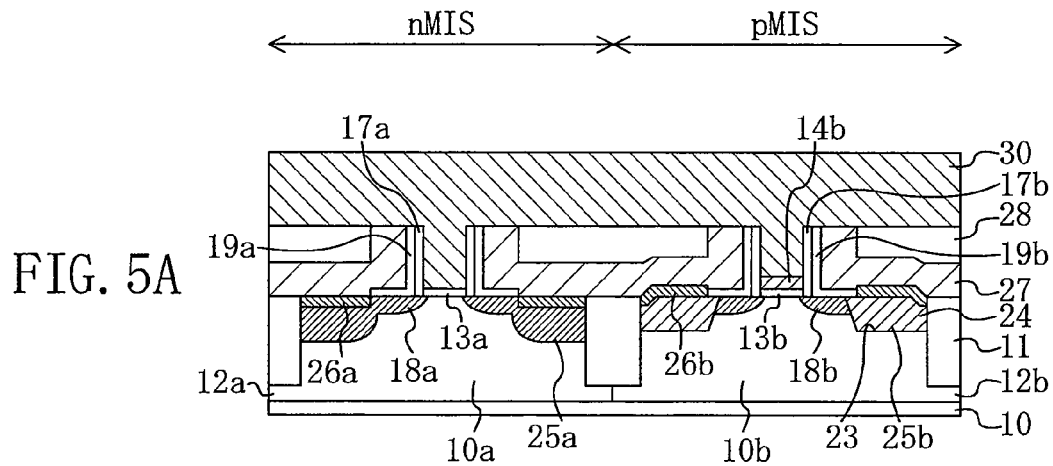
FIGS. 5A-5C are cross-sectional views showing main steps of the manufacture method of the semiconductor device of the first embodiment of the present disclosure in an order in which the steps are performed, as viewed in a gate length direction thereof.

Next, as shown in FIG. 5A, the resist mask 29 is removed, and thereafter, a second metal film 30 made of, for example, tantalum nitride (TaN) is formed on the semiconductor substrate 10 by, for example, CVD, ALD, sputtering or the like, filling the first and second recesses Ca and Cb. Here, the second metal film 30 is desirably made of a metal material or a metal compound material optimized for the n-type MIS transistor (hereinafter referred to as an "nMIS metal material"), and desirably has a work function of 4.05 eV or more and 4.6 eV or less. Specific examples of the second metal film 30 include, in addition to TaN, metals such as tantalum (Ta), hafnium (Hf) and the like, nitrides containing at least one of Ta and Hf, carbon nitride, silicon nitride, and the like.

Figure 5B:
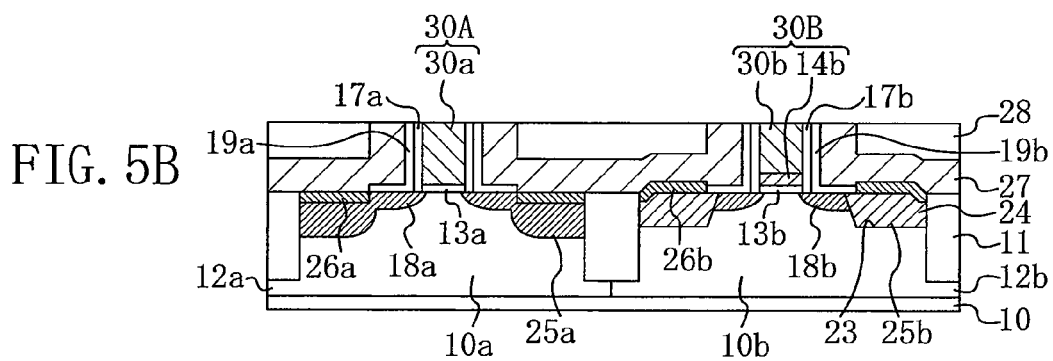

Next, as shown in FIG. 5B, the second metal film 30 is removed by, for example, CMP or etchback until an upper surface of the insulating film 27 is exposed. As a result, a second metal film 30a is formed on the first gate insulating film 13a in the first recess Ca, and a second metal film 30b is formed on the first metal film 14b in the second recess Cb.

Thus, a first gate electrode 30A made of the second metal film 30a is formed on the first active region 10a with the first gate insulating film 13a being interposed therebetween, and a second gate electrode 30B made of the first and second metal films 14b and 30b is formed on the second active region 10b with the second gate insulating film 13b being interposed therebetween.

Figure 5C:
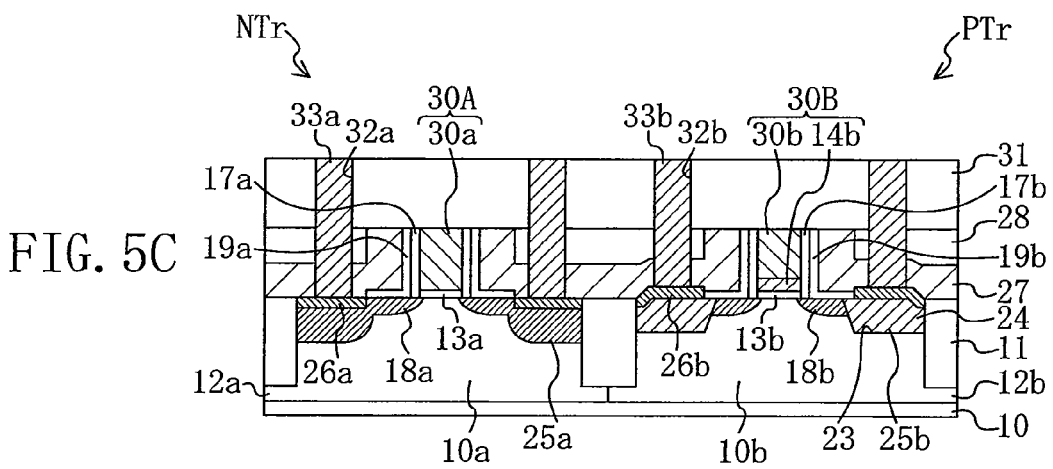

Next, as shown in FIG. 5C, a second inter-layer insulating film 31 is deposited on the first inter-layer insulating film 28 by, for example, CVD, covering the first and second gate electrodes 30A and 30B, and thereafter, a surface of the second inter-layer insulating film 31 is planarized by, for example, CMP.

Thereafter, as in a method for manufacturing a semiconductor device having a typical MIS transistor, a resist (not shown) is formed on the second inter-layer insulating film 31, and thereafter, first and second contact holes 32a and 32b reaching upper surfaces of the first and second metal silicide films 26a and 26b are formed in the insulating film 27, the first inter-layer insulating film 28 and the second inter-layer insulating film 31 by dry etching using the resist as a mask. In this case, if a two-step etching method is used in which etching is temporarily stopped at the time that the insulating film 27 is exposed, the amount of over-etching of the first and second metal silicide films 26a and 26b can be reduced.

Thereafter, titanium and titanium nitride are successively deposited on bottom portions and sidewall portions of the first and second contact holes 32a and 32b by sputtering or CVD, to form a barrier metal film. Thereafter, a tungsten film is deposited on the second inter-layer insulating film 31 by CVD, filling the first and second contact holes 32a and 32b, and thereafter, the tungsten film formed outside the first and second contact holes 32a and 32b is removed by CMP. Thus, first and second contact plugs 33a and 33b are formed by filling the first and second contact holes 32a and 32b with the tungsten film with the barrier metal film being interposed therebetween. Thereafter, a metal wire (not shown) which electrically connects the first and second contact plugs 33a and 33b is formed on the second inter-layer insulating film 31.

Thus, the semiconductor device of this embodiment, i.e., a semiconductor device including an n-type MIS transistor NTr having the first gate electrode 30A made of the second metal film 30a and a p-type MIS transistor PTr having the second gate electrode 30B made of the first metal film 14b and second metal film (conductive film) 30b, can be manufactured.

Figure 6A:
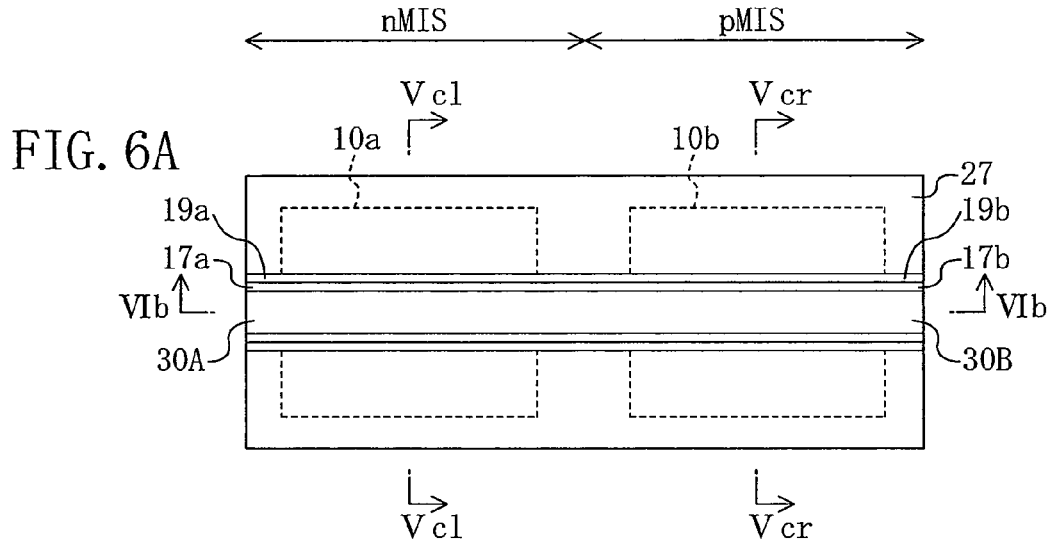
FIGS. 6A and 6B are diagrams showing a structure of the semiconductor device of the first embodiment of the present disclosure.
Figure 6B:
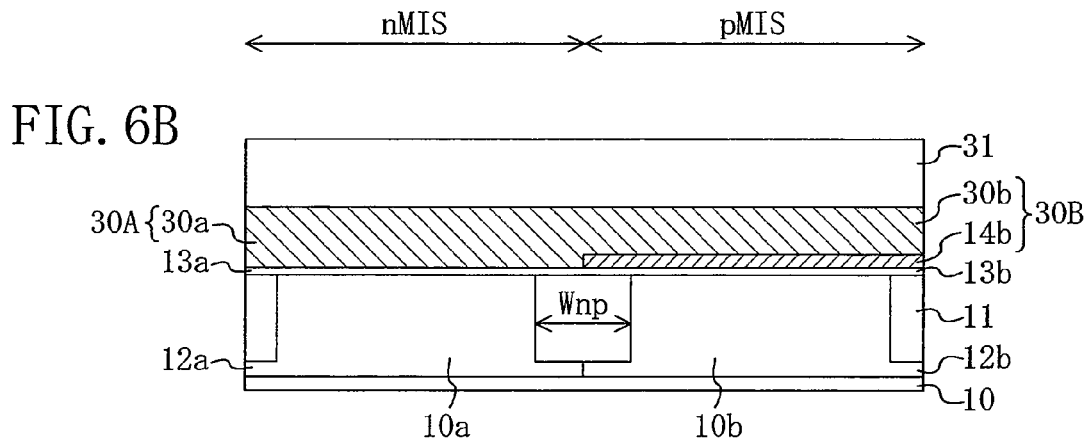

A structure of the semiconductor device of the first embodiment of the present disclosure will be described hereinafter with reference to FIGS. 6A and 6B. FIGS. 6A and 6B are diagrams showing the structure of the semiconductor device of the first embodiment of the present disclosure. Specifically, FIG. 6A is a plan view and FIG. 6B is a cross-sectional view as viewed in a gate width direction thereof, taken along line VIb-VIb of FIG. 6A. Note that line Vcl-Vcl shown in FIG. 6A corresponds to a cross-section line in the left portion of FIG. 5C, and line Vcr-Vcr shown in FIG. 6A corresponds to a cross-section line in the right portion of FIG. 5C. Note that, in FIGS. 6A and 6B, "nMIS" shown on the left side indicates an n-type MIS formation region where an n-type MIS transistor is formed, and "pMIS" shown on the right side indicates a p-type MIS formation region where a p-type MIS transistor is formed.

As shown in FIG. 6A, the first active region 10a surrounded by the isolation region is formed in the n-type MIS formation region, and the second active region 10b surrounded by the isolation region is formed in the p-type MIS formation region. The first gate electrode 30A is formed on the first active region 10a with the first gate insulating film being interposed therebetween, and the second gate electrode 30B is formed on the second active region 10b with the second gate insulating film being interposed therebetween. The insulating film 27 is formed on the side surfaces of the first and second gate electrodes 30A and 30B with the first and second offset spacers 17a and 17b and the first and second inner sidewalls 19a and 19b being successively interposed therebetween. Although the first inter-layer insulating film (see 28 in FIG. 5C) and the second inter-layer insulating film (see 31 in FIG. 5C) are not shown in FIG. 6A, the first inter-layer insulating film is actually formed on the insulating film 27. Also, the second inter-layer insulating film is actually formed on the first inter-layer insulating film, covering the first and second gate electrodes 30A and 30B.

As shown in FIG. 6B, the isolation region 11 formed by filling the trench with insulating film is formed in an upper portion of the semiconductor substrate 10, separating the n-type MIS formation region from the p-type MIS formation region. The p-type well region 12a is formed in the n-type MIS formation region of the semiconductor substrate 10, and the n-type well region 12b is formed in the p-type MIS formation region of the semiconductor substrate 10. The first gate electrode 30A made of the second metal film 30a is formed on the first active region 10a with the first gate insulating film 13a being interposed therebetween, and the second gate electrode 30B made of the first metal film 14b and the second metal film (conductive film) 30b formed on the first metal film 14b are formed on the second active region 10b with the second gate insulating film 13b being interposed therebetween. The second inter-layer insulating film 31 is formed on the semiconductor substrate 10, covering the first and second gate electrodes 30A and 30B.

Here, structures of the n-type MIS transistor and the p-type MIS transistor will be described with reference to FIG. 5C.

As shown in FIG. 5C, the n-type MIS transistor NTr includes the first active region 10a surrounded by the isolation region 11 in the semiconductor substrate 10, the first gate insulating film 13a formed on the first active region 10a, the first gate electrode 30A made of the second metal film 30a formed on the first gate insulating film 13a, the first inner sidewalls 19a having an L-shaped cross-section formed on the side surfaces of the first gate electrode 30A with the first offset spacers 17a being interposed therebetween, the shallow n-type source/drain regions 18a formed in the first active region 10a laterally outside the first gate electrode 30A, the deep n-type source/drain region 25a formed in the first active region 10a laterally outside the first inner sidewalls 19a, the insulating film 27 formed extending over the side surfaces of the first gate electrode 30A and the upper surfaces of the regions located in the first active region 10a laterally outside the first gate electrodes 30A, and the first metal silicide film 26a formed in the upper portions of the deep n-type source/drain regions 25a.

As shown in FIG. 5C, the p-type MIS transistor PTr includes the second active region 10b surrounded by the isolation region 11 in the semiconductor substrate 10, the second gate insulating film 13b formed on the second active region 10b, the second gate electrode 30B made of the first metal film 14b and second metal film (conductive film) 30b formed on the second gate insulating film 13b, the second inner sidewalls 19b having an L-shaped cross-section formed on the side surfaces of the second gate electrode 30B with the second offset spacer 17b being interposed therebetween, the shallow p-type source/drain regions 18b formed in the second active region 10b laterally outside the first gate electrode 30B, the deep p-type source/drain regions 25b including the silicon mixed crystal layer 24 formed in the second active region 10b laterally outside the second inner sidewalls 19b, the insulating film 27 formed extending over the side surfaces of the second gate electrode 30B and the upper surfaces of the regions located in the second active region 10b laterally outside the second gate electrode 30B, and the second metal silicide film 26b formed in the upper portions of the deep p-type source/drain regions 25b.

The second metal film 30a included in the first gate electrode 30A is made of a metal material (or a metal compound material) having a work function of 4.05 eV or more and 4.6 eV or less, and the first metal film 14b included in the second gate electrode 30B is made of a metal material (or a metal compound material) having a work function of 4.6 eV or more and 5.15 eV or less. Thus, the second metal film 30a and the first metal film 14b are made of different metal materials (or metal compound materials) having different work functions.

Also, the first and second gate electrodes 30A and 30B have the upper surfaces having the same height. The first gate electrode 30A is made of the second metal film 30a, and the second gate electrode 30B is made of the first metal film 14b and the second metal film 30b. Therefore, a thickness of the second metal film 30a is larger than a thickness of each of the first metal film 14b and the second metal film (conductive film) 30b.

The insulating film 27 is formed on the side surfaces of the first and second gate electrodes 30A and 30B and the upper regions located in the first and second active regions 10a and 10b laterally outside the first and second gate electrodes 30A and 30B, and the insulating film 27 is not formed on any of the upper surfaces of the first and second gate electrodes 30A and 30B. Also, a thickness of the insulating film 27 is smaller than a thickness of each of the first and second gate electrodes 30A and 30B.

The first and second gate insulating films 13a and 13b are formed in the same step and are made of the same insulating material.

According to this embodiment, after the first and second gate electrode formation portions 14A and 14B (see FIG. 1C) are formed in the same step, the second metal film 30a is formed in the first recess Ca (see FIG. 4C) which has been formed by successively removing the first silicon film 15a and the first metal film 14a in the first gate electrode formation portion 14A, to form the first gate electrode 30A (see FIG. 5B) made of the second metal film 30a. On the other hand, the second metal film 30b is formed in the second recess Cb (see FIG. 4B) which has been formed by removing the second silicon film 15b in the second gate electrode formation portion 14B, to form the second gate electrode 30B (see FIG. 5B) made of the first and second metal films 14b and 30b. Therefore, when the first metal film 14a in the first gate electrode formation portion 14A is removed, the resist mask 29 which does not cover one of the n-type MIS formation region and the p-type MIS formation region and covers the other is formed as shown in FIG. 4C, and therefore, a matching margin is required for the isolation region 11. On the other hand, when the first and second gate electrode formation portions 14A and 14B are formed, a matching margin is not required for the isolation region 11. Therefore, the number of steps in which a matching margin is required for the isolation region 11 (hereinafter referred to as "matching margin requiring steps") can be suppressed to one, and therefore, a width in the gate width direction of the matching margin can be narrowed to reduce a width in the gate width direction of the isolation region 11 (see Wnp in FIG. 6B). Thus, the semiconductor device can be further miniaturized.

Figure 14A:
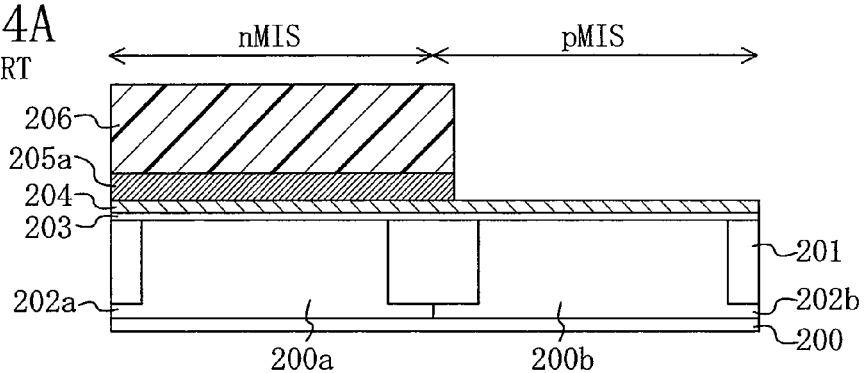
FIGS. 14A-14E are cross-sectional views showing main steps of a second conventional semiconductor device manufacturing method in an order in which the steps are performed, as viewed in a gate width direction thereof.
Figure 14B:
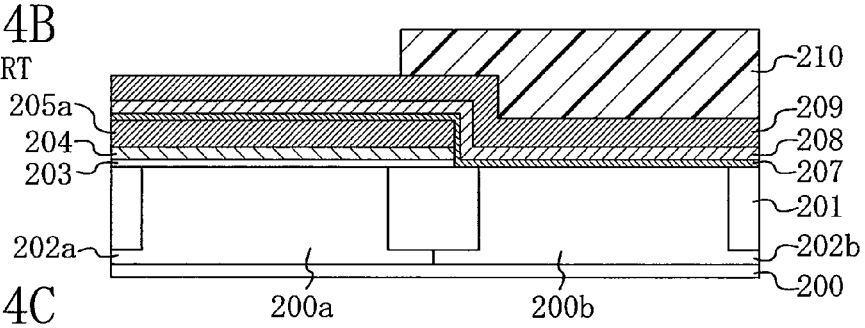
Figure 14C:
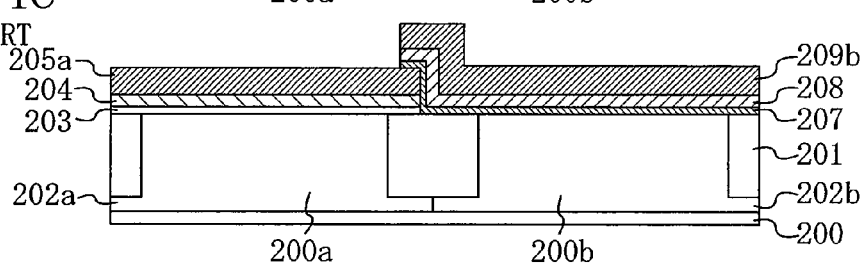

In contrast to this, in the second conventional semiconductor device manufacturing method, a matching margin is required for the isolation region 201 when the resist mask 206 is formed in the step of FIG. 14A, and a matching margin is required for the isolation region 201 when the resist mask 210 is formed in the step of FIG. 14B, i.e., there are two matching margin requiring steps. Therefore, as described above, the width in the gate width direction of the isolation region 201 cannot be reduced.

In addition, as shown in FIG. 1C, the same silicon film 15, the same first metal film 14, and the same gate insulating film formation film 13 are successively subjected to patterning in the same step to form the first and second gate electrode formation portions 14A and 14B, whereby the first and second gate electrode formation portions 14A and 14B can be easily formed with high precision. As a result, the first metal film 14a and the first silicon film 15a in the first gate electrode formation portion 14A which have been formed with high precision are replaced with the second metal film 30a to form the first gate electrode 30A made of the second metal film 30a, and the second silicon film 15b in the second gate electrode formation portion 14B which has been formed with precision is replaced with the second metal film 30b to form the second gate electrode 30B made of the first and second metal films 14b and 30b. Thus, the first and second gate electrodes 30A and 30B can be formed with high precision.

Figure 13:
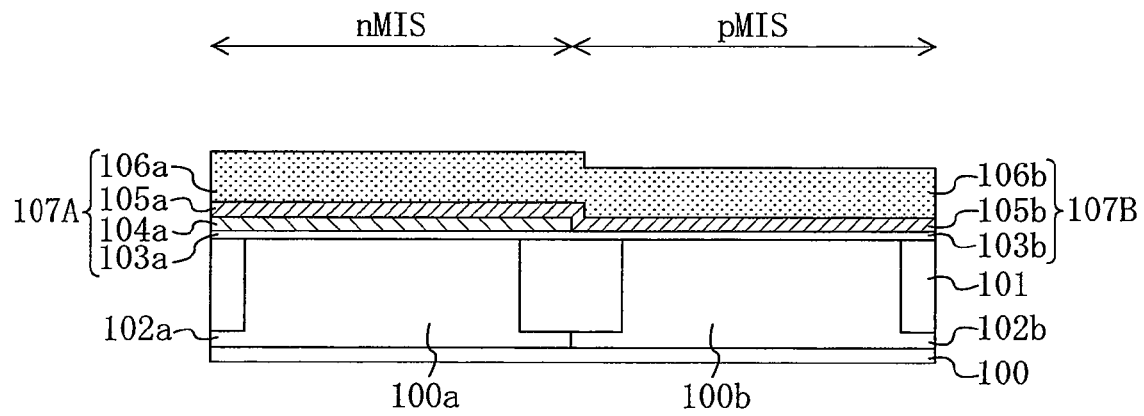
FIG. 13 is a cross-sectional view showing main steps of a first conventional semiconductor device manufacturing method, as viewed in a gate width direction thereof.
Figure 14D:
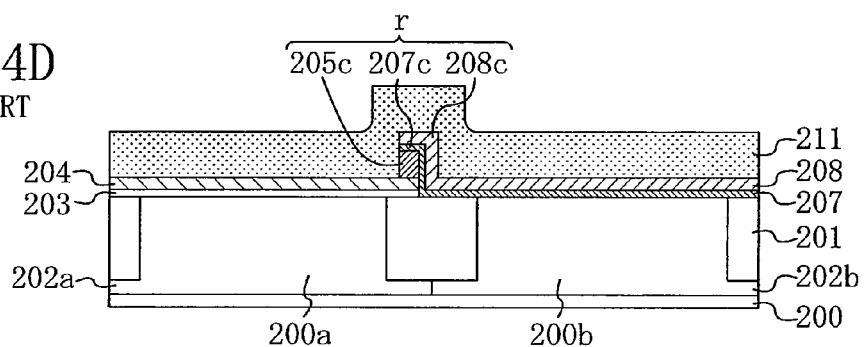
Figure 14E:
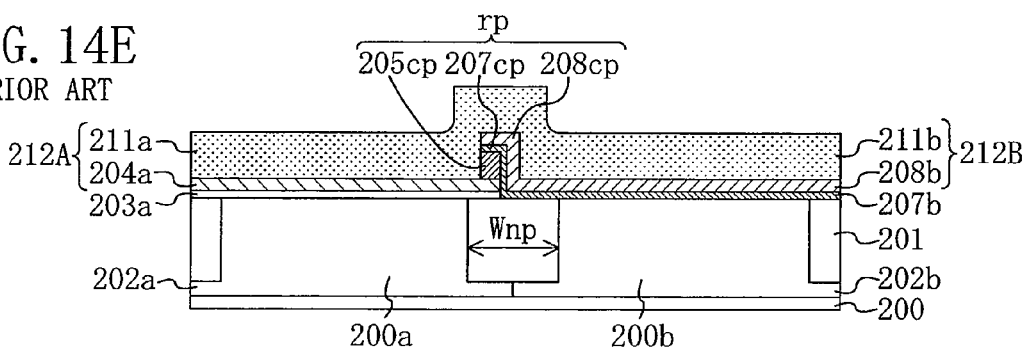
Figure 15:
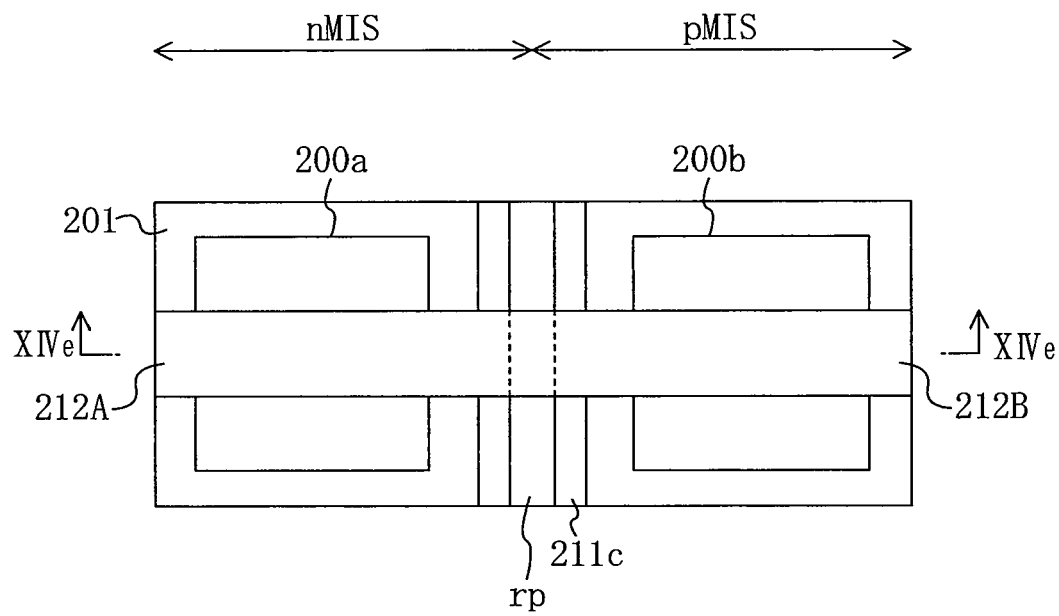
FIG. 15 is a plan view indicating a problem with the second conventional semiconductor device manufacturing method.
Figure 16:
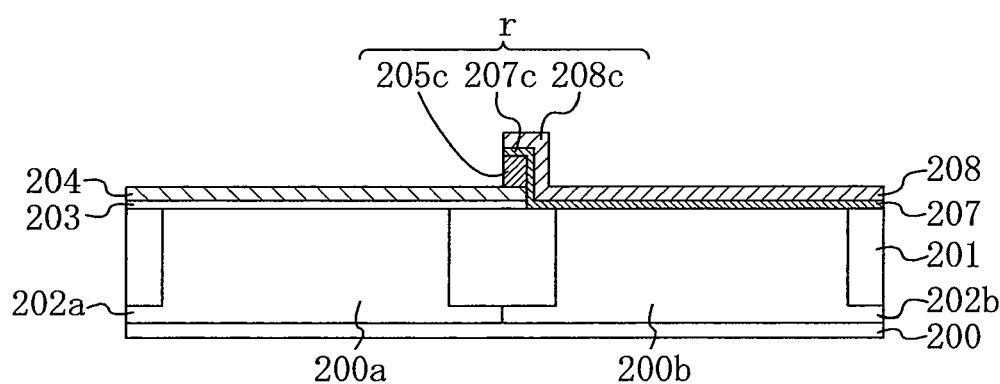
FIG. 16 is a cross-sectional view indicating the problem with the second conventional semiconductor device manufacturing method, as viewed in a gate width direction thereof.

In contrast to this, in the first conventional semiconductor device manufacturing method, as shown in FIG. 13, the first and second patterning portions 107A and 107B, which have different structures, are subjected to patterning in the same step. Therefore, as described above, the first and second gate electrodes cannot both be formed with high precision. On the other hand, also in the second conventional semiconductor device manufacturing method, as shown in FIG. 14D, the first and second patterning portions, which have different structures, are subjected to patterning in the same step. Therefore, as described above, the first and second gate electrodes cannot both be formed with high precision.

Moreover, the deep p-type source/drain region 25b includes the silicon mixed crystal layer 24 which causes compressive stress in the gate length direction of the channel region in the second active region 10b, and therefore, compressive stress can be applied in the gate length direction of the channel region in the second active region 10b, whereby the drive capability of the p-type MIS transistor can be improved.

Note that, in the first embodiment, in order to improve the drive capability of the p-type MIS transistor, the steps of FIGS. 2B-3A are successively performed after the formation of the first and second sidewalls 20A and 20B (see FIG. 2A) and before the formation of the deep n- and p-type source/drain regions 25a and 25b (see FIG. 3B), thereby forming the silicon mixed crystal layer 24 made of, for example, a p-type SiGe layer in the trenches 23 formed in the second active region 10b laterally outside the second sidewalls 20B. The present disclosure is not limited to this specific example.

For example, as shown in FIG. 2A, after the formation of the first and second sidewalls 20A and 20B, the deep n- and p-type source/drain regions 25a and 25b may be formed as shown in FIG. 3B, without successively performing the steps of FIGS. 2B-3A, i.e., without forming the silicon mixed crystal layer 24.

Also, for example, a silicon mixed crystal layer (e.g., an n-type SiC layer) which causes tensile stress in the gate length direction of the channel region in the first active region 10a may be formed in the trenches formed in the first active region 10a laterally outside the first sidewalls 20A, after the formation of the first and second sidewalls 20A and 20B (see FIG. 2A) and before the formation of the deep n- and p-type source/drain regions 25a and 25b (see FIG. 3B). In this case, the drive capability of the n-type MIS transistor can be improved rather than that of the p-type MIS transistor.

Second Embodiment

A semiconductor device according to a second embodiment of the present disclosure and a method for manufacturing the semiconductor device will be described with reference to the drawings. Note that differences between the semiconductor device of the second embodiment and the manufacture method of the semiconductor device, and the semiconductor device of the first embodiment and the manufacture method of the semiconductor device will be mainly described, and their common points will not be described unless necessary.

The manufacture method of the semiconductor device of the second embodiment of the present disclosure will be described hereinafter with reference to FIGS. 7A-7C and FIGS. 8A-8C. FIGS. 7A-8C are cross-sectional views showing main steps of the manufacture method of the semiconductor device of the second embodiment of the present disclosure in an order in which the steps are performed, as viewed in a gate length direction thereof. Note that, in FIGS. 7A-8C, the same components as those of the first embodiment are indicated by the same reference symbols as those shown in FIGS. 1A-5C of the first embodiment. Also, in FIGS. 7A-8C, "nMIS" shown on the left side indicates an n-type MIS formation region where an n-type MIS transistor is formed, and "pMIS" shown on the right side indicates a p-type MIS formation region where a p-type MIS transistor is formed.

Figure 7A:
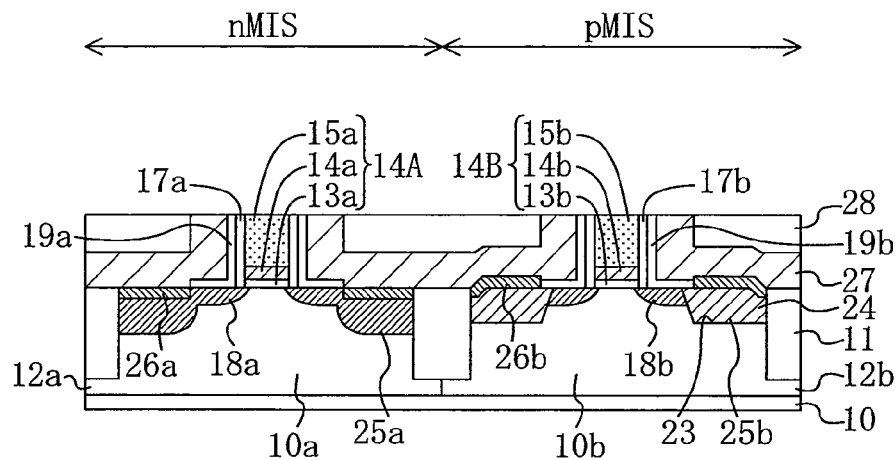
FIGS. 7A-7C are cross-sectional views showing main steps of a method for manufacturing a semiconductor device according to a second embodiment of the present disclosure in an order in which the steps are performed, as viewed in a gate length direction thereof.

Initially, the steps of FIGS. 1A-4A in the first embodiment are successively performed to obtain a structure shown in FIG. 7A (i.e., the same structure as that of FIG. 4A).

Figure 7B:
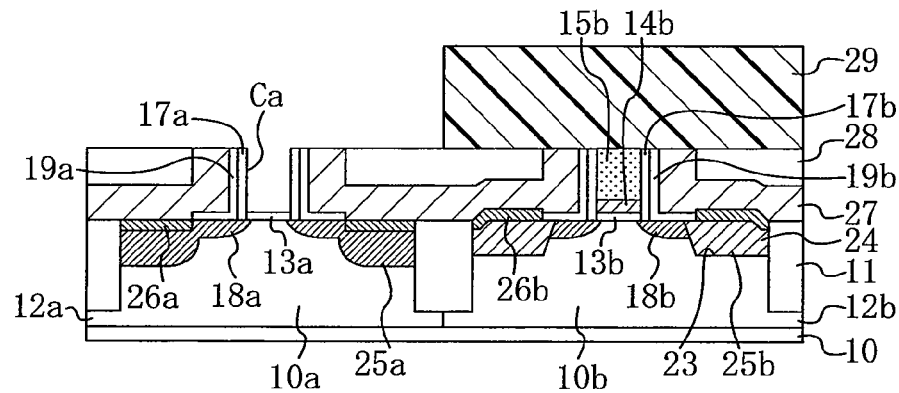

Next, as shown in FIG. 7B, a resist mask 29 which does not cover the n-type MIS formation region and covers the p-type MIS formation region is formed on the semiconductor substrate 10, and thereafter, the first silicon film 15a in the first gate electrode formation portion 14A is removed using dry etching or wet etching having a selectivity ratio with respect to the first metal film 14a, the first offset spacers 17a, the first inner sidewalls 19a, the insulating film 27, and the first inter-layer insulating film 28. Thereafter, the first metal film 14a in the first gate electrode formation portion 14A is removed using wet etching having a selectivity ratio with respect to the first gate insulating film 13a, the first offset spacers 17a, the first inner sidewalls 19a, the insulating film 27, and the first inter-layer insulating film 28.

Thus, the first silicon film 15a and the first metal film 14a in the first gate electrode formation portion 14A are successively removed to form, on the first active region 10a, a first recess Ca which is surrounded by the insulating film 27 with the first offset spacers 17a and the first inner sidewalls 19a being successively interposed therebetween. The first gate insulating film 13a is exposed from a bottom of the first recess Ca.

Figure 7C:
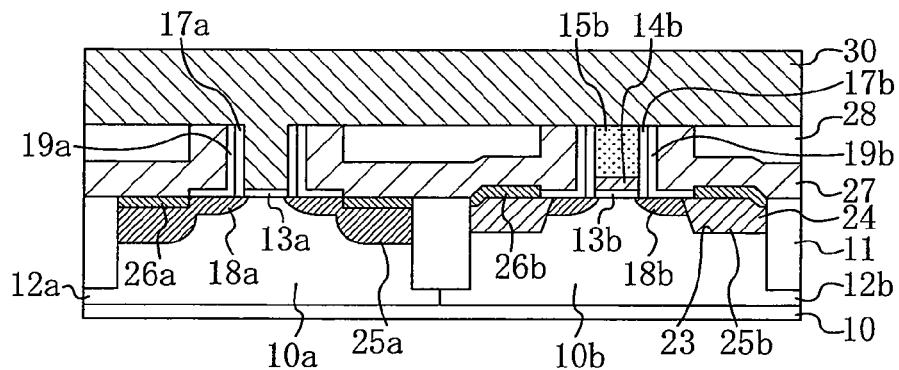

Next, as shown in FIG. 7C, the resist mask 29 is removed, and thereafter, a second metal film 30 made of, for example, TaN is formed on the semiconductor substrate 10 by, for example, CVD, ALD, sputtering or the like, filling the first recess Ca.

Figure 8A:
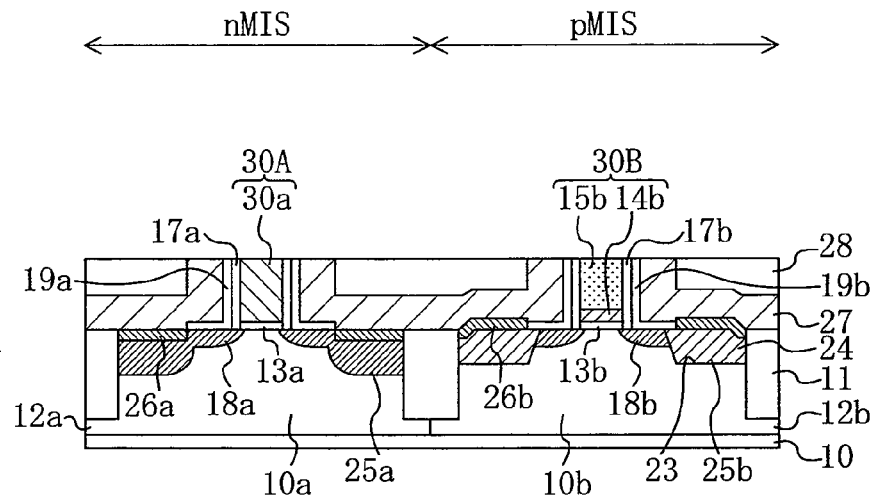
FIGS. 8A-8C are cross-sectional views showing main steps of the manufacture method of the semiconductor device of the second embodiment of the present disclosure in an order in which the steps are performed, as viewed in a gate length direction thereof.

Next, as shown in FIG. 8A, the second metal film 30 is removed by, for example, CMP or etchback until an upper surface of the insulating film 27 is exposed. As a result, a second metal film 30a is formed on the first gate insulating film 13a in the first recess Ca.

Thus, the first gate electrode 30A made of the second metal film 30a is formed on the first active region 10a with the first gate insulating film 13a being interposed therebetween, and the second gate electrode 30B made of the first metal film 14b and the second silicon film 15b is formed on the second active region 10b with the second gate insulating film 13b being interposed therebetween.

Figure 8B:
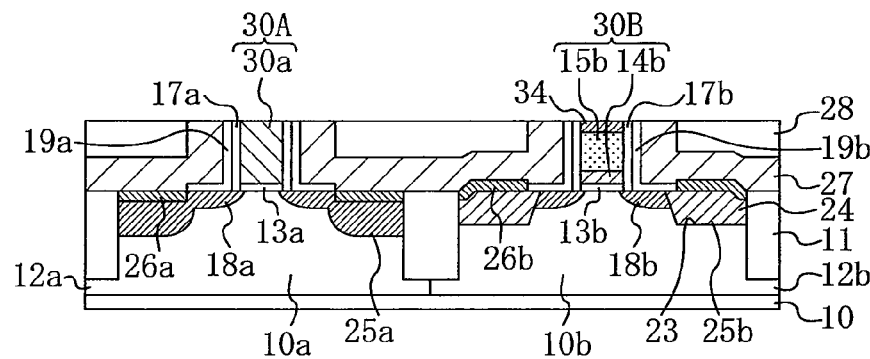

Next, as shown in FIG. 8B, natural oxide film (not shown) formed on a surface of the second silicon film 15b is removed, and thereafter, a metal film (not shown) made of, for example, nickel having a thickness of 10 nm is deposited on an entire surface of the semiconductor substrate 10 by, for example, sputtering. Thereafter, Si in the second silicon film 15b and Ni in the metal film are caused to react with each other by, for example, a first RTA treatment in nitrogen atmosphere at 320° C., to form a metal silicide film 34 made of nickel silicide in an upper portion of the second silicon film 15b.

Thereafter, the semiconductor substrate 10 is immersed in an etchant which is a mixture solution of sulfuric acid and hydrogen peroxide in water, to remove unreacted metal film remaining on the first inter-layer insulating film 28, the insulating film 27, the first and second inner sidewalls 19a and 19b, the first and second offset spacers 17a and 17b and the like, followed by a second RTA treatment at a higher temperature (e.g., 550° C.) than that in the first RTA treatment, thereby stabilizing the silicide composition ratio of the metal silicide film 34.

Figure 8C:
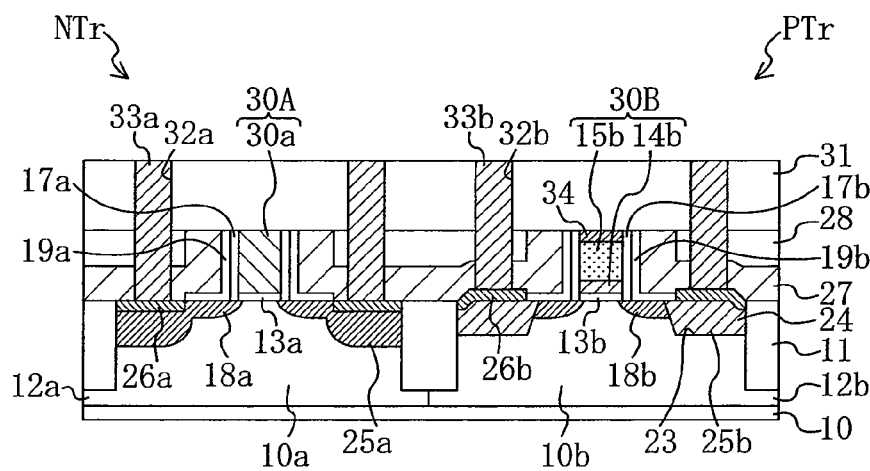

Next, as shown in FIG. 8C, a second inter-layer insulating film 31 is deposited on the first inter-layer insulating film 28 by, for example, CVD, covering the first and second gate electrodes 30A and 30B, and thereafter, a surface of the second inter-layer insulating film 31 is planarized by, for example, CMP. Thereafter, as in a method for manufacturing a semiconductor device having a typical MIS transistor, first and second contact plugs 33a and 33b which connect to the first and second metal silicide films 26a and 26b are formed in the first and second contact holes 32a and 32b in the insulating film 27, the first inter-layer insulating film 28 and the second inter-layer insulating film 31. Thereafter, a metal wire (not shown) which electrically connects the first and second contact plugs 33a and 33b is formed on the second inter-layer insulating film 31.

Thus, the semiconductor device of this embodiment, i.e., a semiconductor device including the n-type MIS transistor NTr having the first gate electrode 30A made of the second metal film 30a and the p-type MIS transistor PTr having the second gate electrode 30B made of the first metal film 14b and the second silicon film (conductive film) 15b, can be manufactured.

Here, the manufacture methods of this embodiment and the first embodiment are different from each other in the following points.

In the first embodiment, as shown in FIG. 4B, the second metal film 30b is formed in the second recess Cb which has been formed by removing the second silicon film 15b in the second gate electrode formation portion 14B, to form the second gate electrode 30B made of the first metal film 14b in the second gate electrode formation portion 14B, and the second metal film 30b.

In contrast to this, in this embodiment, the second silicon film 15b in the second gate electrode formation portion 14B is not removed as is different from FIG. 4B in the first embodiment, and the second gate electrode 30B made of the first metal film 14b and the second silicon film 15b in the second gate electrode formation portion 14B is formed. In addition, after the formation of the second gate electrode 30B, the metal silicide film 34 is formed on the second silicon film 15b in the second gate electrode 30B as shown in FIG. 8B.

Figure 9:
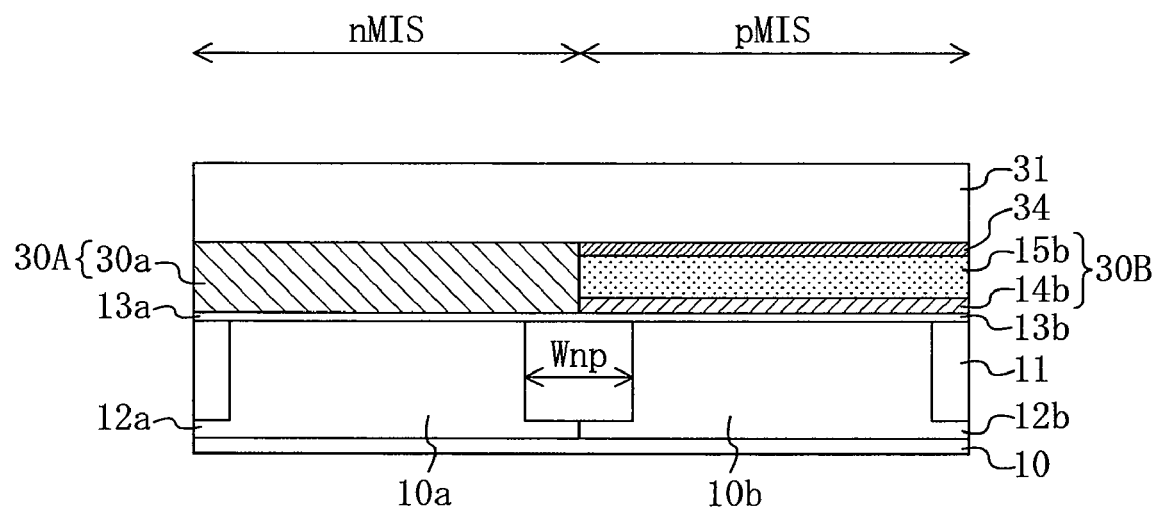
FIG. 9 is a cross-sectional view showing a structure of the semiconductor device of the second embodiment of the present disclosure, as viewed in a gate width direction thereof.

A structure of the semiconductor device of the second embodiment of the present disclosure will be described hereinafter with reference to FIG. 9. FIG. 9 is a cross-sectional view showing the structure of semiconductor device of the second embodiment of the present disclosure, as viewed in a gate width direction thereof. Note that, in FIG. 9, the same components as those of the first embodiment are indicated by the same reference symbols as those of FIG. 6B in the first embodiment. Note that, in FIG. 9, "nMIS" shown on the left side indicates an n-type MIS formation region where an n-type MIS transistor is formed, and "pMIS" shown on the right side indicates a p-type MIS formation region where a p-type MIS transistor is formed.

As shown in FIG. 9, the first gate electrode 30A made of the second metal film 30a is formed on the first active region 10a with the first gate insulating film 13a being interposed therebetween, and the second gate electrode 30B made of the first metal film 14b and the second silicon film (conductive film) 15b formed on the first metal film 14b is formed on the second active region 10b with the second gate insulating film 13b being interposed therebetween. The metal silicide film 34 is formed on the second silicon film 15b.

Here, the structure of this embodiment is different from that of the first embodiment in the following points.

In this embodiment, the second gate electrode 30B is made of the first meal film 14b and the second silicon film 15b. Also, the metal silicide film 34 is formed on the second silicon film 15b. In contrast to this, in the first embodiment, the second gate electrode 30B is made of the first metal film 14b and the second metal film 30b.

Thus, the conductive film formed on the first metal film 14b in the second gate electrode 30B is the second silicon film 15b in this embodiment, and is the second metal film 30b in the first embodiment.

According to this embodiment, after the first and second gate electrode formation portions 14A and 14B (see FIG. 1C) are formed in the same step, the second metal film 30a is formed in the first recess Ca (see FIG. 7B) which has been formed by successively removing the first silicon film 15a and the first metal film 14a in the first gate electrode formation portion 14A, thereby forming the first gate electrode 30A (see FIG. 8A) made of the second metal film 30a. On the other hand, the second gate electrode 30B made of the first meal film 14b and the second silicon film 15b in the second gate electrode formation portion 14B is formed. Therefore, when the first silicon film 15a and the first metal film 14a in the first gate electrode formation portion 14A are removed, a matching margin is required for the isolation region 11 so as to form the resist mask 29 which does not cover one of the n- and p-type MIS formation regions and covers the other as shown in FIG. 7B. On the other hand, when the first and second gate electrode formation portions 14A and 14B are formed, a matching margin is not required for the isolation region 11. Therefore, the number of matching margin requiring steps can be suppressed to one, and therefore, the width in the gate width direction of the isolation region 11 (see Wnp in FIG. 9) can be reduced, whereby the semiconductor device can be further miniaturized.

In addition, as shown in FIG. 1C, the same silicon film 15, the same first metal film 14, and the same gate insulating film formation film 13 are successively subjected to patterning in the same step, to form the first and second gate electrode formation portions 14A and 14B. Therefore, the first and second gate electrode formation portions 14A and 14B can be easily formed with high precision. As a result, the first metal film 14a and the first silicon film 15a in the first gate electrode formation portion 14A which have been formed with high precision are replaced with the second metal film 30a to form the first gate electrode 30A made of the second metal film 30a, and the second gate electrode 30B made of the first meal film 14b and the second silicon film 15b in the second gate electrode formation portion 14B which have been formed with high precision, can be formed. Therefore, the first and second gate electrodes 30A and 30B can be formed with high precision.

Moreover, as in the first embodiment, the deep p-type source/drain region 25b includes the silicon mixed crystal layer 24, and therefore, compressive stress can be applied in the gate length direction of the channel region in the second active region 10b, whereby the drive capability of the p-type MIS transistor can be improved.

Variation of Second Embodiment

A semiconductor device according to a variation of the second embodiment of the present disclosure and a method for manufacturing the semiconductor device will be described hereinafter with reference to the drawings. Note that differences between the semiconductor device of the variation of the second embodiment of the present disclosure and a manufacture method of the semiconductor device and the semiconductor device of the second embodiment of the present disclosure and a manufacture method of the semiconductor device will be mainly described, and their common points will not be described unless necessary.

The manufacture method of the semiconductor device of the variation of the second embodiment of the present disclosure will be described hereinafter with reference to FIGS. 10A-10C and 11A-11C. FIGS. 10A-11C are cross-sectional views showing main steps of the manufacture method of the semiconductor device of the variation of the second embodiment of the present disclosure in an order in which the steps are performed, as viewed in a gate length direction thereof. Note that, in FIGS. 10A-11C, the same components as those of the second embodiment are indicated by the same reference symbols as those in FIGS. 7A-8C of the second embodiment. Note that, in FIGS. 10A-11C, "nMIS" shown on the left side indicates an n-type MIS formation region where an n-type MIS transistor is formed, and "pMIS" shown on the right side indicates a p-type MIS formation region where a p-type MIS transistor is formed.

Initially, the steps of FIGS. 1A-4A in the first embodiment are successively performed to obtain the structure of FIG. 7A as in the second embodiment. Note that the gate insulating film formation film 13 of this variation desirably has a thickness optimized for the p-type MIS transistor and is desirably made of an insulating material optimized for the p-type MIS transistor.

Next, as shown in FIG. 10A, a resist mask 29 which does not cover the n-type MIS formation region and covers the p-type MIS formation region is formed on the semiconductor substrate 10, and thereafter, the first silicon film 15a in the first gate electrode formation portion 14A is removed using dry etching or wet etching having a selectivity ratio with respect to the first metal film 14a, the first offset spacers 17a, the first inner sidewalls 19a, the insulating film 27, and the first inter-layer insulating film 28. Thereafter, the first metal film 14a in the first gate electrode formation portion 14A is removed using wet etching having a selectivity ratio with respect to the first gate insulating film 13a, the first offset spacers 17a, the first inner sidewalls 19a, the insulating film 27, and the first inter-layer insulating film 28. Thus, a step similar to that of FIG. 7B in the second embodiment is performed.

Thereafter, the first gate insulating film 13a in the first gate electrode formation portion 14A is removed using wet etching having a selectivity ratio with respect to the semiconductor substrate.

Thus, the first silicon film 15a, the first metal film 14a, and the first gate insulating film 13a in the first gate electrode formation portion 14A are successively removed to form, on the first active region 10a, a first recess Ca which is surrounded by the insulating film 27 with the first offset spacers 17a and the first inner sidewalls 19a being successively interposed therebetween. The first gate insulating film 13a is exposed from a bottom of the first recess Ca.

Next, as shown in FIG. 10B, the resist mask 29 is removed, and thereafter, a chemical oxide film (not shown) is formed on a surface of the semiconductor substrate 10 by, for example, a Hydrochloric Acid/Hydrogen Peroxide/Water Mixture (HPM) treatment. Thereafter, a gate insulating film formation film 35 made of, for example, a high-k film having a thickness of 2 nm is deposited on the semiconductor substrate 10 by, for example, MOCVD, covering the inside of the first recess Ca. Here, the gate insulating film formation film 35 desirably includes a high-k film made of a metal oxide having a relative dielectric constant of 10 or more. Moreover, the gate insulating film formation film 35 desirably has a thickness optimized for the n-type MIS transistor and is desirably made of an insulating material optimized for the n-type MIS transistor.

Thereafter, a second metal film 30 made of, for example, TaN is deposited on the semiconductor substrate 10 by, for example, CVD, ALD, sputtering or the like, filling the first recess Ca with the gate insulating film formation film 35 being interposed therebetween.

Next, as shown in FIG. 10C, the second metal film 30 and the gate insulating film formation film 35 are removed by, for example, CMP or etchback until an upper surface of the insulating film 27 is exposed. As a result, a third gate insulating film 35a is formed in the first recess Ca, and a second metal film 30a is formed on the third gate insulating film 35a. Here, the third gate insulating film 35a is formed, extending over an upper surface of the first active region 10a in the first recess Ca and side surfaces of the second metal film 30a. Therefore, although not shown in FIG. 10C which is a cross-sectional view in the gate length direction, the third gate insulating film 35a is formed and interposed between the second metal film 30a, and the first meal film 14b and the second silicon film 15b, which are adjacent to each other in the gate width direction.

Next, as shown in FIG. 11A, an upper portion of the third gate insulating film 35a is removed by, for example, etching or a diluted hydrofluoric acid treatment having a selectivity ratio with respect to the second metal film 30a, thereby causing heights of upper ends of the third gate insulating film 35a to be lower than a height of an upper surface of the second metal film 30a, to form a groove R. Here, the groove R is formed along a periphery of the second metal film 30a, exposing side surfaces of the second metal film 30a. Therefore, although not shown in FIG. 11A which is a cross-sectional view in the gate length direction, the groove R is formed between the second metal film 30a and the second silicon film 15b, which are adjacent to each other in the gate width direction, and side surfaces in the gate width direction of the second metal film 30a and side surfaces in the gate width direction of the second silicon film 15b are exposed in the groove R.

Thus, by successively performing the steps of FIGS. 10B-11A, the third gate insulating film 35a is formed in the first recess Ca, and the second metal film 30a whose side surfaces are exposed in the groove R is formed on the third gate insulating film 35a.

Thus, the first gate electrode 30A made of the second metal film 30a is formed on the first active region 10a with the third gate insulating film 35a being interposed therebetween, and the second gate electrode 30B made of the first meal film 14b and the second silicon film 15b is formed on the second active region 10b with the second gate insulating film 13b being interposed therebetween.

Next, as shown in FIG. 11B, natural oxide film (not shown) formed on a surface of the second silicon film 15b is removed, and thereafter, a metal film (not shown) made of, for example, nickel having a thickness of 10 nm is deposited on an entire surface of the semiconductor substrate 10 by, for example, sputtering. Thereafter, Si in the second silicon film 15b and Ni in the metal film are caused to react with each other by, for example, a first RTA treatment in nitrogen atmosphere at 320° C., to form a metal silicide film 34 made of nickel silicide on the second silicon film 15b. In this case, the metal silicide film 34 of this variation is also formed in the groove R formed between the second metal film 30a and the second silicon film 15b due to expansion of its volume. Specifically, the metal silicide film 34 is formed above and in contact with side surfaces in the gate width direction of the second metal film 30a and side surfaces in the gate width direction of the second silicon film 15b which are exposed in the groove R (see 34 in FIG. 12 described below). Therefore, the metal silicide film 34 can electrically connect the second metal film 30a and the second silicon film 15b.

Thereafter, the semiconductor substrate 10 is immersed in an etchant which is a mixture solution of sulfuric acid and hydrogen peroxide in water to remove unreacted metal film remaining on the first inter-layer insulating film 28, the insulating film 27, the first and second inner sidewalls 19a and 19b, the first and second offset spacers 17a and 17b and the like, followed by a second RTA treatment at a higher temperature (e.g., 550° C.) than that in the first RTA treatment, thereby stabilizing the silicide composition ratio of the metal silicide film 34.

Next, as shown in FIG. 11C, a second inter-layer insulating film 31 is deposited on the first inter-layer insulating film 28 by, for example, CVD, covering the first and second gate electrodes 30A and 30B, and thereafter, a surface of the second inter-layer insulating film 31 is planarized by, for example, CMP. Thereafter, as in a method for manufacturing a semiconductor device having a typical MIS transistor, first and second contact plugs 33a and 33b which connect to the first and second metal silicide films 26a and 26b are formed in the first and second contact holes 32a and 32b formed in the insulating film 27, the first inter-layer insulating film 28, and the second inter-layer insulating film 31. Thereafter, a metal wire (not shown) which electrically connects to the first and second contact plugs 33a and 33b is formed on the second inter-layer insulating film 31. Thus, a step similar to that of FIG. 8C in the second embodiment is performed.

Thus, the semiconductor device of this embodiment, i.e., a semiconductor device including the n-type MIS transistor NTr having the first gate electrode 30A made of the second metal film 30a and the p-type MIS transistor PTr having the second gate electrode 30B made of the first metal film 14b and the second silicon film (conductive film) 15b, can be manufactured.

Here, the manufacture method of this variation is different from that of the second embodiment in the following points.

In the second embodiment, the second metal film 30a is formed on the first gate insulating film 13a in the first recess Ca (see FIG. 7B) which has been formed by removing the first silicon film 15a and the first metal film 14a in the first gate electrode formation portion 14A.

In contrast to this, in this variation, the third gate insulating film 35a is formed in the first recess Ca (see FIG. 10A) which has been formed by removing the first gate insulating film 13a in addition to the first silicon film 15a and the first metal film 14a in the first gate electrode formation portion 14A, and the second metal film 30a is formed on the third gate insulating film 35a.

Figure 12:
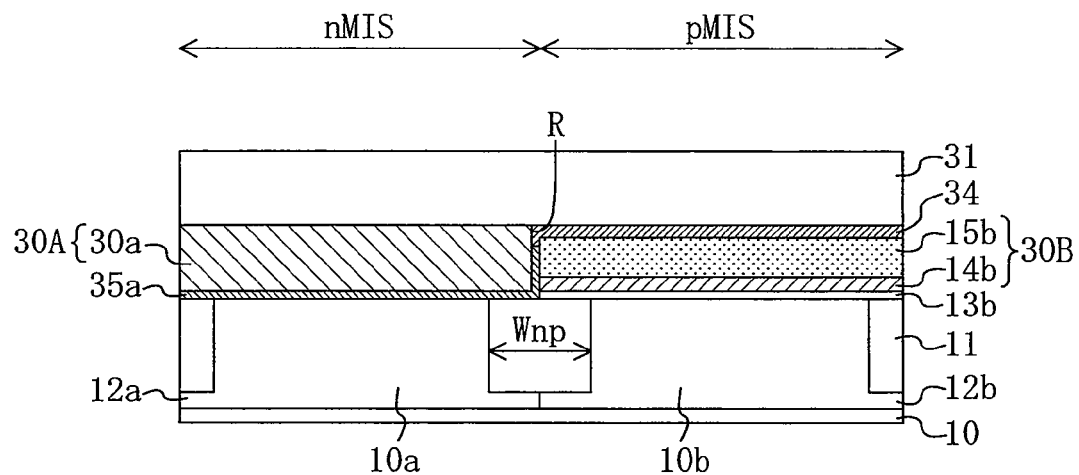
FIG. 12 is a cross-sectional view showing a structure of the semiconductor device of the variation of the second embodiment of the present disclosure, as viewed in a gate width direction thereof.

Also, in this variation, the first gate insulating film 13a in the first gate electrode formation portion 14A is replaced with the third gate insulating film 35a, and therefore, the third gate insulating film 35a is interposed between the first and second gate electrodes 30A and 30B, which are adjacent to each other in the gate width direction. Therefore, in this variation, when the metal silicide film 34 (see FIG. 11B) is formed, an upper portion of the third gate insulating film 35a is removed to form the groove R, thereby exposing, to the groove R, side surfaces in the gate width direction of the second metal film 30a and side surfaces in the gate width direction of the second silicon film 15b, as shown in FIG. 11A, so as to electrically connect the first and second gate electrodes 30A and 30B. As a result, although not shown in FIG. 11B which is a cross-sectional view in the gate length direction, the metal silicide film 34 can be formed above and in contact with side surfaces in the gate width direction of the second metal film 30a and side surfaces in the gate width direction of the second silicon film 15b which are exposed to the inside of the groove R as shown in FIG. 12 described below. Therefore, by electrically connecting the second metal film 30a and the second silicon film 15b, the first and second gate electrodes 30A and 30B can be electrically connected.

A structure of the semiconductor device of the variation of the second embodiment of the present disclosure will be described hereinafter with reference to FIG. 12. FIG. 12 is a cross-sectional view showing the structure of the semiconductor device of the variation of the second embodiment of the present disclosure, as viewed in a gate width direction thereof. Note that, in FIG. 12, the same components as those in the second embodiment are indicated by the same reference symbols as those of FIG. 9 in the second embodiment. Note that, in FIG. 12, "nMIS" shown on the left side indicates an n-type MIS formation region where an n-type MIS transistor is formed, and "pMIS" shown on the right side indicates a p-type MIS formation region where a p-type MIS transistor is formed.

As shown in FIG. 12, the first gate electrode 30A made of the second metal film 30a is formed on the first active region 10a with the third gate insulating film 35a being interposed therebetween, and the second gate electrode 30B made of the first metal film 14b and the second silicon film (conductive film) 15b formed on the first metal film 14b is formed on the second active region 10b with the second gate insulating film 13b being interposed therebetween. The metal silicide film 34 is formed on the second silicon film 15b.

Here, the structure of this variation is different from that of the second embodiment in the following points.

In this variation, the third gate insulating film 35a is made of an insulating material different from that of the second gate insulating film 13b. Also, as shown in FIG. 12, the third gate insulating film 35a is formed, extending over an upper surface of the first active region 10a and side surfaces in the gate width direction of the second metal film 30a, and is interposed between a lower region of the first gate electrode 30A and a lower region of the second gate electrode 30B (note that, as shown in FIG. 11C, the third gate insulating film 35a is also formed on side surfaces in the gate length direction of the second metal film 30a in addition to the side surfaces in the gate width direction thereof). Also, the metal silicide film 34 is formed above and in contact with side surfaces in the gate width direction of the second metal film 30a and side surfaces in the gate width direction of the second silicon film 15b which are exposed in the groove R. The metal silicide film 34 also electrically connects to the first and second gate electrodes 30A and 30B.

In contrast to this, in the second embodiment, the first gate insulating film 13a is made of the same insulating material as that of the second gate insulating film 13b. Also, the first gate insulating film 13a is not interposed between the first and second gate electrodes 30A and 30B.

Thus, the gate insulating film in the n-type MIS formation region and the gate insulating film in the p-type MIS formation region are made of different insulating material in this variation, and they are made of the same insulating material in the second embodiment.

According to this variation, an effect similar to that of the second embodiment can be obtained.

In addition, the third gate insulating film 35a has a thickness optimized for the n-type MIS transistor and is made of an insulating material optimized for the n-type MIS transistor (hereinafter referred to as an "nMIS insulating material"). Also, the second gate insulating film 13b has a thickness optimized for the p-type MIS transistor and is made of an insulating material optimized for the p-type MIS transistor (hereinafter referred to as a "pMIS insulating material"). Therefore, the flexibility of transistor design is increased, whereby a desired transistor characteristic can be achieved.

Note that, in the first and second embodiments, a pMIS metal film made of a pMIS metal material is used as the first metal film 14, and an nMIS metal film made of an nMIS metal material is used as the second metal film 30. The first metal film (pMIS metal film) 14a and the first silicon film 15a in the first gate electrode formation portion 14A are replaced with the second metal film (nMIS metal film) 30a to form the first gate electrode 30A made of the second metal film 30a, and the second gate electrode 30B including the first metal film (pMIS metal film) 14b in the second gate electrode formation portion 14B is formed. The present disclosure is not limited to this specific example.

Conversely, an nMIS metal film may be used as the first metal film 14, and a pMIS metal film may be used as the second metal film 30. Note that, in this case, the first metal film (nMIS metal film) and the second silicon film in the second gate electrode formation portion are replaced with the second metal film (pMIS metal film) to form the second gate electrode made of the second metal film, and the first gate electrode including the first metal film (nMIS metal film) in the first gate electrode formation portion is formed.

Also, in the variation of the second embodiment, an nMIS metal film may be used as the first metal film 14, and a pMIS metal film may be used as the second metal film 30. Note that, in this case, an nMIS insulating film made of an nMIS insulating material is used as the gate insulating film formation film 13, and a pMIS insulating film made of a pMIS insulating material is used as the gate insulating film formation film 35.

Note that, in the first embodiment, the second embodiment and its variation, after the first and second outer sidewalls 20a and 20b are removed as shown in FIG. 3C, an underlying insulating film made of a silicon nitride film is formed as the insulating film 27 by, for example, plasma CVD as shown in FIG. 3D. The present disclosure is not limited to this specific example. For example, after the removal of the first and second outer sidewalls 20a and 20b, a stress insulating film which causes tensile stress in the gate length direction of the channel region in the first active region 10a may be formed as the insulating film 27. Here, the stress insulating film is specifically formed as follows. A silicon nitride film containing a large amount of hydrogen is deposited by, for example, plasma CVD, followed by irradiation with ultraviolet light to remove hydrogen contained in the silicon nitride film, thereby forming an stress insulating film made of the silicon nitride film.

Thus, the stress insulating film applies tensile stress in the gate length direction of the channel region in the first active region 10a, whereby the drive capability of the n-type MIS transistor can be improved. Therefore, in addition to the improvement of the drive capability of the p-type MIS transistor by the silicon mixed crystal layer 24 as in the first embodiment, the second embodiment and its variation, the drive capability of the n-type MIS transistor can be improved by the stress insulating film.

In addition, the stress insulating film is formed after the first and second outer sidewalls 20a and 20b are removed, and therefore, a thickness of the stress insulating film can be increased by an amount corresponding to the removed portions of the first and second outer sidewalls 20a and 20b. As a result, tensile stress can be effectively applied in the gate length direction of the channel region in the first active region 10a.

Moreover, the stress insulating film can be formed closer to the channel region in the first active region 10a by an amount corresponding to the removed portions of the first and second outer sidewalls 20a and 20b. As a result, tensile stress can be more effectively applied in the gate length direction of the channel region in the first active region 10a.

Thus, when a stress insulating film is used as the insulating film 27 rather than an underlying insulating film, then if the first and second outer sidewalls 20a and 20b are previously removed before the stress insulating film is formed, tensile stress caused by the stress insulating film can be effectively applied in the gate length direction of the channel region in the first active region 10a.

On the other hand, when an underlying insulating film is used as the insulating film 27 as in the first embodiment, the second embodiment and its variation, it is not always necessary to remove the first and second outer sidewalls 20a and 20b before the insulating film 27 is formed as shown in FIG. 3C.

Note that, in the first embodiment, the second embodiment and its variation, the silicon mixed crystal layer 24 is used to improve the drive capability of the p-type MIS transistor. The present disclosure is not limited to this specific example. Both the drive capability of the n-type MIS transistor and the drive capability of the p-type MIS transistor may be improved. Firstly, for example, as in the first embodiment, the second embodiment and its variation, the silicon mixed crystal layer 24 may be provided, and a silicon mixed crystal layer which causes tensile stress in the gate length direction of the channel region in the first active region 10a may be provided in the trenches formed laterally outside the first sidewall 20A in the first active region 10a. Secondly, for example, a silicon mixed crystal layer which causes tensile stress in the gate length direction of the channel region in the first active region 10a may be provided in the trenches formed laterally outside the first sidewall 20A in the first active region 10a, and a stress insulating film which causes compressive stress in the gate length direction of the channel region in the second active region 10b may be provided as the insulating film 27.

Note that specific examples of the gate insulating film formation film 13 in the first and second embodiments, or the gate insulating film formation film 13 and the gate insulating film formation film 35 in the variation of the second embodiment, include hafnium-based oxides such as hafnium oxide (HfO$_2$), hafnium silicate (HfSiO), and hafnium silicon oxynitride (HfSiON) and the like, and oxides containing tantalum (Ta), zirconium (Zr), titanium (Ti), aluminum (Al), scandium (Sc), yttrium (Y), lanthanum (La) or the like. One of these insulating materials which is suitable for both the n-type MIS transistor and the p-type MIS transistor is used as the gate insulating film formation film 13 in the first and second embodiments. Also, an insulating material optimized for the p-type MIS transistor and an insulating material optimized for the n-type MIS transistor are used as the gate insulating film formation film 13 and the gate insulating film formation film 35 in the variation of the second embodiment. In this case, the gate insulating film formation film 35 for the n-type MIS transistor and the gate insulating film formation film 13 for the p-type MIS transistor may be made of different insulating materials or the same insulating material. When the gate insulating film formation film 35 and the gate insulating film formation film 13 are made of the same insulating material, they may be optimized by changing their thicknesses or compositions (e.g., concentrations).

Also, although a polysilicon film is used as the silicon film 15 in the first embodiment, the second embodiment and its variation, a silicon film made of other semiconductor materials, such as an amorphous silicon film, a silicon film and the like, may be used.

Also, in the first embodiment, the second embodiment and its variation, when the first and second metal silicide films 26a and 26b are formed, a metal film made of nickel is used as the metal film which is caused to react with upper portions of the deep n- and p-type source/drain regions 25a and 25b. Instead of this, a metal film made of a metal for silicidation, such as platinum, cobalt, titanium, tungsten or the like, may be used.

The present disclosure can provide gate electrodes of n- and p-type MIS transistors which are formed with high precision, and an isolation region having a reduced width in the gate width direction, and therefore, is useful for a dual-metal gate semiconductor device and a method for manufacturing the semiconductor device.

What is claimed is:

1. A semiconductor device comprising:
   a first MIS transistor; and
   a second MIS transistor, wherein:
   the first MIS transistor includes:
      a first gate insulating film formed on a first active region in a semiconductor substrate, and including a first high-k film of oxide containing hafnium and silicon;
      a first gate electrode including a second metal film formed on the first gate insulating film;
      first sidewall spacers formed on side surfaces of the first gate electrode, the first sidewall spacers being insulative; and
      a silicon nitride film formed, extending over the side surfaces of the first gate electrode on which the first sidewall spacers are formed and upper surfaces of regions located in the first active region laterally outside the first sidewall spacers,
   the second MIS transistor includes:
      a second gate insulating film formed on a second active region in the semiconductor substrate, and including a second high-k film made of oxide containing hafnium and silicon;
      a second gate electrode including a first metal film formed on the second gate insulating film and a conductive film formed on the first metal film;
      second sidewall spacers formed on side surfaces of the second gate electrode, the second sidewall spacers being insulative;
      the silicon nitride film formed, extending over the side surfaces of the second gate electrode on which the second sidewall spacers are formed and upper surfaces of regions located in the second active region laterally outside the second sidewall spacers; and
      source/drain regions formed in the second active region laterally outside the second sidewall spacers,
   the first and second metal films are made of different metal materials,
   the silicon nitride film is not formed on any of upper surfaces of the first and second gate electrodes,
   the source/drain regions include a silicon mixed crystal layer which is formed in trenches provided in the second active region, and causes first stress in a gate length direction of a channel region in the second active region, and
   the silicon nitride film has a thickness smaller than that of the first gate electrode.

2. The semiconductor device of claim 1, wherein the first metal film has a thickness smaller than that of the second metal film.

3. The semiconductor device of claim 1, wherein the first and second metal films have different work functions.

4. The semiconductor device of claim 1, wherein the conductive film is made of the second metal film.

5. The semiconductor device of claim 1, wherein the conductive film is made of a silicon film, and the semiconductor device further comprises a metal silicide film formed on the silicon film.

6. The semiconductor device of claim 1, wherein the first and second gate insulating films are made of the same insulating material.

7. The semiconductor device of claim 1, wherein:
   each of the first sidewall spacers is made of a first inner sidewall having an L-shaped cross-section, and
   each of the second sidewall spacers is made of a second inner sidewall having an L-shaped cross-section, and the silicon nitride film is formed in contact with surfaces of the first and second inner sidewalls which are bent in an L-shape.

8. The semiconductor device of claim 1, wherein the silicon nitride film causes second stress in a gate length direction of a channel region in the first active region.

9. The semiconductor device of claim 8, wherein:
the first MIS transistor is an n-type MIS transistor, and
the second stress is tensile stress.

10. The semiconductor device of claim 1, wherein
the second MIS transistor is a p-type MIS transistor,
the silicon mixed crystal layer is made of a SiGe layer, and
the first stress is compressive stress.

11. A semiconductor device comprising:
a first MIS transistor; and
a second MIS transistor, wherein:
the first MIS transistor includes:
  a first gate insulating film formed on a first active region in a semiconductor substrate;
  a first gate electrode including a second metal film formed on the first gate insulating film;
  first sidewall spacers formed on side surfaces of the first gate electrode, the first sidewall spacers being insulative; and
  a silicon nitride film formed, extending over the side surfaces of the first gate electrode on which the first sidewall spacers are formed and upper surfaces of regions located in the first active region laterally outside the first sidewall spacers,
the second MIS transistor includes:
  a second gate insulating film formed on a second active region in the semiconductor substrate,
  a second gate electrode including a first metal film formed on the second gate insulating film and a conductive film formed on the first metal film;
  second sidewall spacers formed on side surfaces of the second gate electrode, the second sidewall spacers being insulative; and
  the silicon nitride film formed, extending over the side surfaces of the second gate electrode on which the second sidewall spacers are formed and upper surfaces of regions located in the second active region laterally outside the second sidewall spacers,
the first and second metal films are made of different metal materials,
the silicon nitride film is not formed on any of upper surfaces of the first and second gate electrodes,
the conductive film is made of a silicon film,
the semiconductor device further comprises a metal silicide film formed on the silicon film, and
the silicon nitride film has a thickness smaller than that of the first gate electrode.

12. The semiconductor device of claim 11, wherein
the first metal film has a thickness smaller than that of the second metal film.

13. The semiconductor device of claim 11, wherein
the first and second metal films have different work functions.

14. The semiconductor device of claim 11, wherein
the first and second gate insulating films are made of the same insulating material.

15. The semiconductor device of claim 11, wherein
the first and second gate insulating films are made of different insulating materials.

16. The semiconductor device of claim 11, wherein:
each of the first sidewall spacers is made of a first inner sidewall having an L-shaped cross-section, and
each of the second sidewall spacers is made of a second inner sidewall having an L-shaped cross-section, and
the silicon nitride film is formed in contact with surfaces of the first and second inner sidewalls which are bent in an L-shape.

17. The semiconductor device of claim 11, further comprising:
source/drain regions formed in the second active region laterally outside the second sidewall spacers,
wherein the source/drain regions include a SiGe layer which is formed in trenches provided in the second active region.

18. The semiconductor device of claim 11, wherein
the first and second gate insulating films include a high-k film made of a metal oxide having a relative dielectric constant of 10 or more.

19. A semiconductor device comprising:
a first MIS transistor; and
a second MIS transistor, wherein:
the first MIS transistor includes:
  a first gate insulating film formed on a first active region in a semiconductor substrate, and including a first high-k film made of oxide containing hafnium and silicon;
  a first gate electrode including a second metal film formed on the first gate insulating film;
  first sidewall spacers formed on side surfaces of the first gate electrode, the first sidewall spacers being insulative; and
  a silicon nitride film formed, extending over the side surfaces of the first gate electrode on which the first sidewall spacers are formed and upper surfaces of regions located in the first active region laterally outside the first sidewall spacers,
the second MIS transistor includes:
  a second gate insulating film formed on a second active region in the semiconductor substrate, and including a second high-k film made of oxide containing hafnium and silicon;
  a second gate electrode including a first metal film formed on the second gate insulating film and a conductive film formed on the first metal film;
  second sidewall spacers formed on side surfaces of the second gate electrode, the second sidewall spacers being insulative; and
  the silicon nitride film formed, extending over the side surfaces of the second gate electrode on which the second sidewall spacers are formed and upper surfaces of regions located in the second active region laterally outside the second sidewall spacers,
the first and second metal films are made of different metal materials,
the silicon nitride film is not formed on any of upper surfaces of the first and second gate electrodes, and
the first metal film is made of titanium nitride.

20. The semiconductor device of claim 19, wherein
the first metal film has a thickness smaller than that of the second metal film.

21. The semiconductor device of claim 19, wherein
the first and second metal films have different work functions.

22. The semiconductor device of claim 19, wherein
the silicon nitride film has a thickness smaller than that of the first gate electrode.

23. The semiconductor device of claim 19, wherein:
each of the first sidewall spacers is made of a first inner sidewall having an L-shaped cross-section, and
each of the second sidewall spacers is made of a second inner sidewall having an L-shaped cross-section, and
the silicon nitride film is formed in contact with surfaces of the first and second inner sidewalls which are bent in an L-shape.

24. The semiconductor device of claim 19, further comprising:
source/drain regions formed in the second active region laterally outside the second sidewall spacers,
wherein the source/drain regions include a SiGe layer which is formed in trenches provided in the second active region.

25. A semiconductor device comprising:
a first MIS transistor; and
a second MIS transistor, wherein:
the first MIS transistor includes:
a first gate insulating film formed on a first active region in a semiconductor substrate;
a first gate electrode including a second metal film formed on the first gate insulating film;
first sidewall spacers formed on side surfaces of the first gate electrode, the first sidewall spacers being insulative; and
a silicon nitride film formed, extending over the side surfaces of the first gate electrode on which the first sidewall spacers are formed and upper surfaces of regions located in the first active region laterally outside the first sidewall spacers,
the second MIS transistor includes:
a second gate insulating film formed on a second active region in the semiconductor substrate;
a second gate electrode including a first metal film formed on the second gate insulating film and a conductive film formed on the first metal film;
second sidewall spacers formed on side surfaces of the second gate electrode, the second sidewall spacers being insulative; and
the silicon nitride film formed, extending over the side surfaces of the second gate electrode on which the second sidewall spacers are formed and upper surfaces of regions located in the second active region laterally outside the second sidewall spacers,
the first and second metal films are made of different metal materials,
the silicon nitride film is not formed on any of upper surfaces of the first and second gate electrodes, and
the silicon nitride film causes first stress in a gate length direction of a channel region in the first active region.

26. The semiconductor device of claim 25, wherein the first metal film has a thickness smaller than that of the second metal film.

27. The semiconductor device of claim 25, wherein the first and second metal films have different work functions.

28. The semiconductor device of claim 25, wherein the silicon nitride film has a thickness smaller than that of the first gate electrode.

29. The semiconductor device of claim 25, wherein the conductive film is made of the second metal film.

30. The semiconductor device of claim 25, wherein:
the conductive film is made of a silicon film, and
the semiconductor device further comprises a metal silicide film formed on the silicon film.

31. The semiconductor device of claim 25, wherein the first and second gate insulating films are made of the same insulating material.

32. The semiconductor device of claim 25, wherein the first and second gate insulating films are made of different insulating materials.

33. The semiconductor device of claim 25, wherein:
each of the first sidewall spacers is made of a first inner sidewall having an L-shaped cross-section,
each of the second sidewall spacers is made of a second inner sidewall having an L-shaped cross-section, and
the silicon nitride film is formed in contact with surfaces of the first and second inner sidewalls which are bent in an L-shape.

34. The semiconductor device of claim 25, further comprising:
source/drain regions formed in the second active region laterally outside the second sidewall spacers,
wherein the source/drain regions include a SiGe layer which is formed in trenches provided in the second active region.

35. The semiconductor device of claim 25, wherein the first and second gate insulating films include a high-k film made of a metal oxide having a relative dielectric constant of 10 or more.

* * * * *